(12) United States Patent
Ogomi et al.

(10) Patent No.: US 10,634,739 B2
(45) Date of Patent: Apr. 28, 2020

(54) MAGNETIC SENSOR DEVICE

(71) Applicant: Mitsubishi Electric Corporation, Chiyoda-ku (JP)

(72) Inventors: Tomokazu Ogomi, Chiyoda-ku (JP); Kenji Shimohata, Chiyoda-ku (JP); Hideki Matsui, Chiyoda-ku (JP); Sadaaki Yoshioka, Chiyoda-ku (JP)

(73) Assignee: Mitsubishi Electric Corporation, Chiyoda-ku (JP)

(*) Notice: Subject to any disclaimer, the term of this patent is extended or adjusted under 35 U.S.C. 154(b) by 0 days.

(21) Appl. No.: 16/480,230

(22) PCT Filed: Jul. 6, 2018

(86) PCT No.: PCT/JP2018/025673
§ 371 (c)(1),
(2) Date: Jul. 23, 2019

(87) PCT Pub. No.: WO2019/017219
PCT Pub. Date: Jan. 24, 2019

(65) Prior Publication Data
US 2020/0003852 A1    Jan. 2, 2020

(30) Foreign Application Priority Data
Jul. 19, 2017    (JP) .................... 2017-139652

(51) Int. Cl.
*G01R 33/12*    (2006.01)
*G01R 33/09*    (2006.01)
(Continued)

(52) U.S. Cl.
CPC ........ *G01R 33/091* (2013.01); *G01R 33/0011* (2013.01); *G01R 33/096* (2013.01); *G07D 7/04* (2013.01)

(58) Field of Classification Search
CPC ................ G01R 33/091; G01R 33/093; G01R 33/095–098; G01R 33/12;
(Continued)

(56) References Cited

U.S. PATENT DOCUMENTS 4,810,965 A * 3/1989 Fujiwara .................. G01D 5/20
324/207.21
4,972,284 A * 11/1990 Smith .................. G11B 5/3903
360/327.1
(Continued)

FOREIGN PATENT DOCUMENTS

EP    2 253 446 A1    11/2010
JP    59-44673 A    3/1984
(Continued)

OTHER PUBLICATIONS

International Search Report dated Sep. 25, 2018 in PCT/JP2018/025673 filed on Jul. 6, 2018.

*Primary Examiner* — Jermele M Hollington
*Assistant Examiner* — Taqi R Nasir
(74) *Attorney, Agent, or Firm* — Oblon, McClelland, Maier & Neustadt, L.L.P.

(57) ABSTRACT

A magnetic sensor device (10) includes a magnetic sensor unit including a magnetoresistive element mounted on a sensor board extending in a longitudinal direction and a magnet (3) located on a surface of the sensor board opposite to a surface on which the magnetoresistive element is mounted, a housing supporting the magnetic sensor unit, a magnetic shield unit (4) covering side surfaces and a bottom surface of the housing, and a cover covering an upper portion of the housing. The magnetic shield unit (4) has an opening (4o) facing in Z-axis direction from the magnetoresistive element toward a transport path of a sensing target. The opening (4o) is defined by two long sides in the longitudinal direction and two short sides in a lateral direc- (Continued)

tion. The two long sides of the magnetic shield unit (4) are nearer to the sensing target in Z-axis direction than the two short sides.

18 Claims, 18 Drawing Sheets

(51) Int. Cl.
    *G01R 33/00*     (2006.01)
    *G07D 7/04*     (2016.01)

(58) Field of Classification Search
    CPC ............ G01R 33/1207; G01R 33/1215; G01R 33/18; G01R 33/24; G01R 33/0011; G01R 33/0035; G01R 33/0047; G01R 33/0052; G01R 33/066; G07D 7/04
    USPC ..................................................... 324/207.21
    See application file for complete search history.

(56) References Cited

U.S. PATENT DOCUMENTS

| | | | | |
|---|---|---|---|---|
| 4,987,508 A * | 1/1991 | Smith | ............... | G11B 5/3903 360/327.23 |
| 5,450,009 A | 9/1995 | Murakami | | |
| 6,998,838 B2 * | 2/2006 | Lin | ............... | G01D 5/145 324/207.2 |
| 7,009,388 B2 * | 3/2006 | Johnson | ............... | G01D 5/145 324/207.24 |
| 7,129,700 B2 * | 10/2006 | Okubo | ............... | G01D 5/145 324/207.25 |
| 7,151,369 B1 * | 12/2006 | Wolf | ............... | G01D 5/145 324/207.24 |
| 8,698,738 B2 * | 4/2014 | Sakurai | ............... | G06F 3/0354 345/156 |
| 2015/0377650 A1 | 12/2015 | Asano et al. | | |
| 2017/0052233 A1 | 2/2017 | Ogomi et al. | | |
| 2017/0154487 A1 | 6/2017 | Asano et al. | | |
| 2017/0199253 A1 | 7/2017 | Okada et al. | | |
| 2019/0056461 A1 | 2/2019 | Matsui et al. | | |

FOREIGN PATENT DOCUMENTS

| | | | |
|---|---|---|---|
| JP | 59-60576 U | | 4/1984 |
| JP | 62-68260 A | | 3/1987 |
| JP | 10-282195 A | | 10/1998 |
| JP | H10282195 A | * | 10/1998 |
| JP | 2005-30872 A | | 2/2005 |
| JP | 2007-140928 A | | 6/2007 |
| JP | 2015-7580 A | | 1/2015 |
| WO | WO 92/12438 A1 | | 7/1992 |
| WO | WO 2009/099173 A1 | | 8/2009 |
| WO | WO 2012/137543 A1 | | 10/2012 |
| WO | WO 2014/123142 A1 | | 8/2014 |
| WO | WO 2015/174409 A1 | | 11/2015 |
| WO | WO 2015/190468 A1 | | 12/2015 |
| WO | WO-2015194605 A1 | * | 12/2015 |
| WO | WO 2016/013438 A1 | | 1/2016 |
| WO | WO 2017/169740 A1 | | 10/2017 |

\* cited by examiner

MAGNETIC SENSOR DEVICE

TECHNICAL FIELD

The present disclosure relates to a magnetic sensor device that detects a magnetic pattern formed on a paper sheet medium.

BACKGROUND ART

A known examples of devices for reading a paper sheet medium include a magnetic sensor device including a magnet and a magnetic sensor to read a magnetic pattern of a magnetic component, such as a magnetic ink, formed on a medium, such as a banknote. A magnetoresistive element (see, for example, Patent Literature 1) or a Hall device is used for a detection by the magnetic sensor.

A magnetic sensor device described in Patent Literature 1 includes a magnet and a magnetoresistive element. The magnet faces one surface of a paper sheet medium containing a magnetic component, and has different magnetic poles in a vertical direction perpendicular to the transport direction of the paper sheet medium, forming a cross magnetic field intersecting with a sensing target. The magnetoresistive element is located between one magnetic pole of the magnet forming a cross field and the paper sheet medium, and outputs, as a change in a resistance value, a change in the component of the cross field in the transport direction due to the magnetic component of the paper sheet medium that is transported in the cross magnetic field. The magnetoresistive element is located between the both ends of one magnetic pole of the magnet in the transport direction, and the magnetoresistive element is arranged such that the magnetoresistive element is deflected in the transport direction from the center of the length of one magnetic pole of the magnet in the transport direction.

A magnetic sensor device in another form described in Patent Literature 1 includes a magnetic circuit and a magnetoresistive element. The magnetic circuit faces one surface of a sensing target containing a magnetic component, and forms a cross magnetic field intersecting with the sensing target between a central portion of the magnetic circuit and yokes located upstream and downstream relative to the central portion in the transport direction of the sensing target. The magnetoresistive element is located between the sensing target and the central portion, and outputs, as a change in a resistance value, a change in the component of the cross magnetic field in the transport direction due to the magnetic component of the sensing target that is transported in the cross magnetic field. The magnetoresistive element is located between the both ends of the central portion in the transport direction, and the magnetoresistive element is arranged such that the magnetoresistive element is deflected in the transport direction from the center of the length of the central portion in the transport direction.

Another magnetic sensor device includes a magnetic shield to avoid leakage of a magnetic field and influence of external factors (e.g., Patent Literature 2 and Patent Literature 3). Another magnetic sensor device includes a shield cover that transmits a magnetic field for electrical shielding (e.g., Patent Literature 4). Another magnetic sensor device includes an outer shell that serves as a shield cover (e.g., Patent Literature 5 and Patent Literature 6).

The magnetic sensor device described in Patent Literature 2 includes a magnetoresistive element fixed to an upper surface of a magnetic material board and a permanent magnet fixed to a lower surface of the magnetic material board, and, in Patent Literature 2, a magnetic shield unit having the ends protruding upward is disposed under the permanent magnet. The magnetic sensor device described in Patent Literature 3 has a magnetic material formed around a magnetic sensor unit including a magnetoresistive element and a magnetic field generator. The magnetic material formed around the magnetic sensor unit serves as a magnetic shield.

The magnetic sensor device described in Patent Literature 4 has different magnetic poles in a vertical direction perpendicular to the transport direction of a paper sheet medium containing a magnetic component. Also, the magnetic sensor device described in Patent Literature 4 includes a magnet extending in a longitudinal direction perpendicular to the transport direction and anisotropic magnetoresistive elements. The anisotropic magnetoresistive elements are linearly arranged in the longitudinal direction. The magnet is characterized in that the length of the magnet in the vertical direction in an end in the longitudinal direction of the magnet is larger than the vertical length of the magnet in a central portion in the longitudinal direction of the magnet.

In the magnetic sensor device described in Patent Literature 4, the length of the magnet in the vertical direction at the end is larger than the length of the magnet in the vertical direction at the central portion, where the vertical direction is perpendicular to the transport direction, so that a bias magnetic flux can be forcibly applied in the same non-magnetosensitive direction (longitudinal direction) of the anisotropic magnetoresistive elements that are implemented by arranging the anisotropic magnetoresistive elements in the linearly arrangement direction. As stated therein, the anisotropic magnetoresistive elements can output signals of the same level in a stable manner even for a magnetic pattern tilted in a planar direction.

The magnetic sensor device described in Patent Literature 5 includes a magnet extending in a longitudinal direction, magnetoresistive elements, and a shield cover extending in the longitudinal direction, wherein the magnet and the magnetoresistive element are contained in or held by a housing and the shield cover is fixed to the housing. The magnetic sensor device described in Patent Literature 6 has a cover fixed with an adhesive for protecting magnetoresistive elements.

CITATION LIST

Patent Literature

Patent Literature 1: International Publication No. WO 2014/123142

Patent Literature 2: Unexamined Japanese Utility Model Application Kokai Publication No. S62-68260

Patent Literature 3: International Publication No. WO 1992/012438

Patent Literature 4: International Publication No. WO 2015/174409

Patent Literature 5: International Publication No. WO 2015/190468

Patent Literature 6: International Publication No. WO 2016/013438

SUMMARY OF INVENTION

Technical Problem

However, such conventional magnetic sensor devices may have an uneven magnetic flux in the longitudinal direction in the ends of the magnetic sensor unit in the longitudinal direction. For example, even if the magnetic sensor device described in Patent Literature 3 includes the magnetic material at the ends in the longitudinal direction, the magnetic material attracts the magnetic flux as in the central portion in the longitudinal direction, thereby causing disturbance of the magnetic flux in the longitudinal direction. In other words, although the magnetic sensor device described in Patent Literature 3 forms the magnetic shield so as to make the performance of the magnetic sensor unit remain constant and includes the magnetic sensor unit that is less susceptible to an external magnetic flux, the magnetic sensor unit can have lower sensitivity in the ends in the longitudinal direction.

In contrast, Patent Literature 4 states that, in the magnetic sensor device, the lengths of the magnet in the vertical direction at the ends in the longitudinal direction is larger than the length of the magnet in the vertical direction at the central portion in the longitudinal direction, where the vertical direction is perpendicular to the transport direction, thereby allowing the magnetic flux to be uniform in the longitudinal direction. However, Patent Literature 4 has a problem that the magnetic sensor unit is susceptible to an external magnetic flux due to a lack of formation of a shield around the magnetic sensor. In the magnetic sensor device described in Patent Literature 4, the magnetic flux in the longitudinal direction of the magnet is required to be reduced to zero, or a bias magnetic flux at a certain level or higher is required to be applied in the longitudinal direction.

In the magnetic sensor device described in Patent Literature 2, an upwardly protruding distal end of the magnetic shield is located to be lower than a portion that comes into contact with a mount board for the permanent magnet. Thus, Patent Literature 2 has a problem that the permanent magnet has no magnetic shield against a magnetic field in the horizontal direction perpendicular to the vertical direction of the magnetic sensor unit. Further, Patent Literature 2 has a problem that the magnetic field in the horizontal direction interferes with the permanent magnet and thus reduces the tolerance to an external magnetic flux. Also, Patent Literature 2 has a problem that the magnetic shield is electrically independent and thus may operate as an antenna, so that the magnetic sensor device has low electromagnetic incoherence and tolerance.

In consideration of the aforementioned circumstances, an objective of the present disclosure is to provide a magnetic sensor device that suppresses a reduction in the sensitivity of a magnetic sensor unit at an end of the magnetic sensor device in a longitudinal direction perpendicular to the transport direction of a sensing target and that also produces the magnetic shielding effect.

Solution to Problem

A magnetic sensor device according to the present disclosure is a sensor to detect a magnetic component of a sensing target. The magnetic sensor device includes (i) a magnetic sensor unit that includes a magnet extending in a longitudinal direction and a magnetoresistive element located between the magnet and the sensing target, (ii) a magnetic shield unit that supports or contains the magnetic sensor unit and that has facing surfaces facing the magnetic sensor unit except at least a portion of a surface of the magnetic sensor unit facing the sensing target, where the facing surfaces include a first side surface and a second side surface that extend in the longitudinal direction and that face each other with the magnet located between the first and second side surfaces, a third side surface and a fourth side surface that extend in a lateral direction intersecting with the longitudinal direction and that face each other with the magnet located between the third and fourth side surfaces, and a bottom surface extending in the longitudinal direction at a position opposite to the sensing target relative to the magnetic sensor unit, and (iv) a cover that is disposed between the magnetic sensor unit and the sensing target and that covers the magnetic shield unit. In the magnetic shield unit, the smallest length of a length of the third side surface and a length of the fourth side surface in a perpendicular direction is smaller than the largest length of a length of the first side surface and a length of the second side surface in the perpendicular direction, where the perpendicular direction is a direction from the bottom surface toward the cover and is perpendicular to the longitudinal direction and the lateral direction.

Advantageous Effects of Invention

The magnetic sensor device according to the above aspects of the present disclosure can achieve uniform distribution of the magnetic flux density of the magnetic sensor unit in the longitudinal direction and suppress a reduction in the sensitivity of the magnetic sensor unit at the ends in the longitudinal direction of the magnetic sensor unit by optimally setting the lengths of the side surfaces of the magnetic shield unit or by optimally setting the relationship between two long sides and two short sides of an opening in the magnetic shield unit.

DESCRIPTION OF EMBODIMENTS

Embodiment 1

Figure 1:
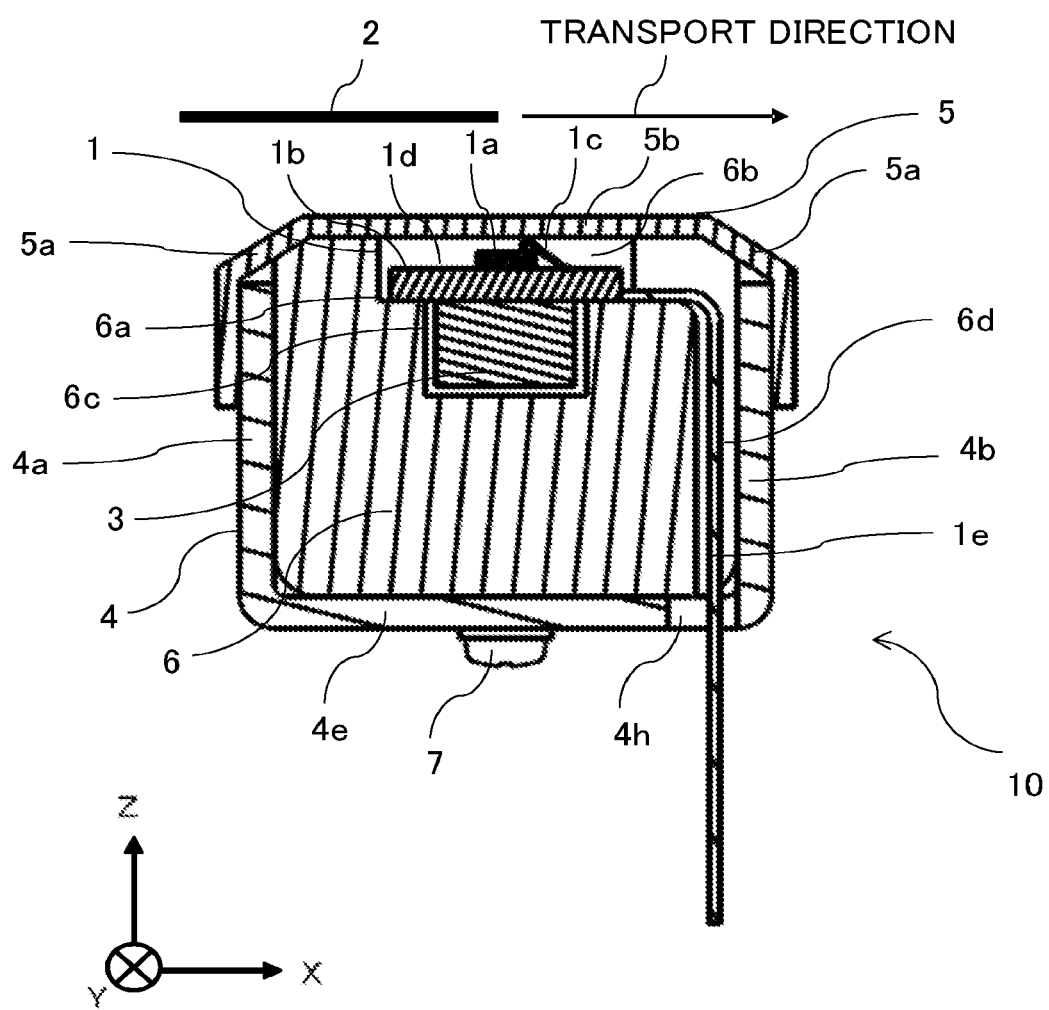
FIG. 1 is a cross-sectional view of a magnetic sensor device according to Embodiment 1 of the present disclosure.

A magnetic sensor device 10 according to Embodiment 1 of the present disclosure is described below with reference to FIGS. 1 to 7. The same or corresponding components in the figures are given the same reference numerals. The magnetic sensor device 10 includes a magnetic sensor unit 1 that is provided with a magnet 3. The magnetic sensor unit 1 detects a magnetic component of a sensing target 2.

In Embodiment 1 and other embodiments, the main scanning direction of the magnetic sensor device 10 is the longitudinal direction of the magnetic sensor unit 1, and the sub scanning direction of the magnetic sensor device 10 is the lateral direction of the magnetic sensor unit 1. The main scanning direction and the sub scanning direction intersect with each other, preferably at right angles. The main scanning direction is also referred to as a reading width direction. The sub scanning direction is also referred to as a transport direction. A direction perpendicular to both the main scanning direction and the sub scanning direction is referred to as a height direction. When a bottom surface 4e described later or a cover 5 described later is placed in a horizontal plane, the height direction is the vertical direction. In Embodiment 1 and other embodiments, the vertical direction is based on this arrangement and remains constant regardless of the installation orientation of the magnetic sensor device 10. In other words, the vertical direction is a direction perpendicular to the longitudinal direction (main scanning direction) and the lateral direction (sub scanning direction).

In Embodiment 1, other embodiments, and the drawings, the sub scanning direction (lateral direction) may be referred to as X-axis direction, the main scanning direction (longitudinal direction) may be referred to as Y-axis direction, and the height direction (vertical direction and perpendicular direction) may be referred to as Z-axis direction. In the drawings, X, Y, and Z respectively indicate X-axis direction, Y-axis direction, and Z-axis direction. Specifically, X indicates X-axis, Y indicates Y-axis, and Z indicates Z-axis. The present embodiment is described under a preferable condition that X-axis and Y-axis are perpendicular to each other. Z-axis is perpendicular to X-axis and Y-axis. In other words, X-axis, Y-axis, and Z-axis intersect with one another at right angles.

The origins of X-axis, Y-axis, and Z-axis are described below. X-axis has the origin at the center of the length in the lateral direction of the magnetic sensor device 10, Y-axis has the origin at the center of the length in the longitudinal direction of the magnetic sensor device 10, and Z-axis has the origin on a transport surface for the sensing target 2 which is described later. More specifically, the transport surface is located away from the later-described cover 5 by several millimeters in the positive direction along Z-axis (positive Z direction). The positive direction along Z-axis (positive Z direction) refers to a direction from the magnetic sensor unit 1 toward the sensing target 2.

In all embodiments, the sensing target 2 is transported in the lateral direction of the magnetic sensor device 10, or alternatively the sensing target 2 is stationary and the magnetic sensor device 10 moves in the lateral direction. In other words, the transport of the sensing target 2 also means the case in which the sensing target 2 is stationary and the magnetic sensor unit 1 moves in the lateral direction (X-axis direction), in addition to the case in which the sensing target 2 itself is transported. The magnetic sensor unit 1 detects the magnetic component of the sensing target 2.

The transport direction (lateral direction) includes the positive direction along X-axis (positive X direction) and the negative direction along X-axis (negative X direction). An area in which the sensing target 2 is transported in the transport direction is referred to as a transport path. The sensing target 2 or the magnetic sensor device 10 may be transported from the positive direction to negative direction along X-axis or from the negative direction to positive direction along X-axis. An area on the transport path between the both ends of the magnetic sensor device 10 in the longitudinal direction and between the both ends in the lateral direction is referred to as the transport surface for the sensing target 2. The reading width direction (longitudinal direction) includes the positive direction along Y-axis (positive Y direction) and the negative direction along Y-axis (negative Y direction).

The sensing target 2 is a medium in the form of a paper sheet, and has a magnetic pattern formed from a magnetic component such as a magnetic ink. The sensing target 2 is a medium in the form of a paper sheet including a banknote, a check, or securities.

FIG. 1 is a cross-sectional view of the magnetic sensor device 10 according to the present embodiment taken along plane XZ. Plane XZ is defined by X-axis and Z-axis. In other words, FIG. 1 is a cross-sectional view taken along the lateral direction (transport direction) or a cross-sectional view taken along the section intersecting with the longitudinal direction of the magnetic sensor device 10 (reading width direction).

Figure 2:
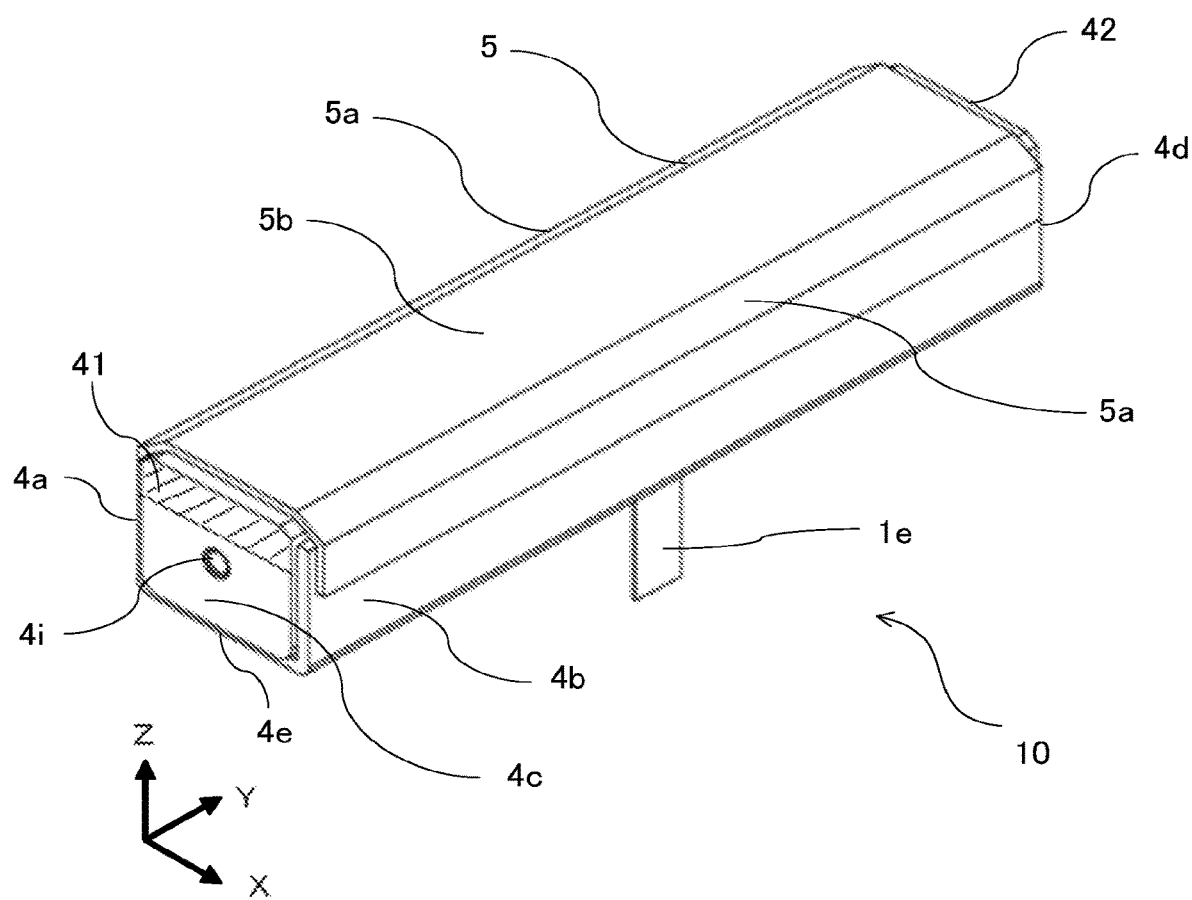
FIG. 2 is a perspective view of the magnetic sensor device according to Embodiments 1 and 6 of the present disclosure.

FIG. 2 is a perspective view of the magnetic sensor device 10 according to the present embodiment. As shown in FIGS. 1 and 2, the magnetic sensor device 10 includes the magnet 3 extending in the longitudinal direction, a magnetic shield unit 4, and the cover 5. Preferably, the magnet 3 may be a permanent magnet. The magnetic shield unit 4 is a box-shaped magnetic shield made with a magnetic material, and the magnetic shield unit 4 supports or contains the magnetic sensor unit 1 containing the magnet 3. The magnetic sensor unit 1 includes a magnetic sensing element. The magnetic sensing element is described in detail later.

Figure 3:
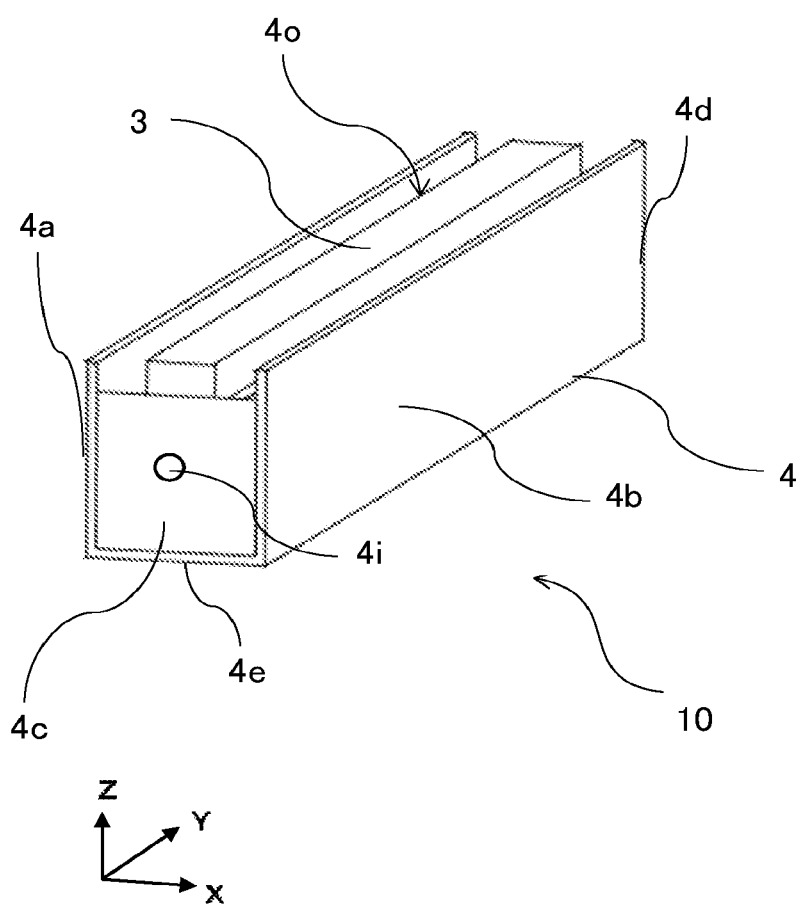
FIG. 3 is a perspective view of a magnetic shield unit in the magnetic sensor device according to Embodiment 1 of the present disclosure.

FIG. 3 is a perspective view of the magnetic shield unit 4 in the magnetic sensor device 10 according to the present embodiment. As shown in FIG. 3, the magnetic shield unit 4 has facing surfaces that face a plurality of surfaces of the magnetic sensor unit 1 except at least a portion of the surface of the magnetic sensor unit 1 facing the sensing target 2. The facing surfaces may preferably include a first side surface 4a, a second side surface 4b, a third side surface 4c, a fourth side surface 4d, and a bottom surface 4e. The first side surface 4a is located in the negative X direction of the magnetic sensor unit 1. The second side surface 4b is located in the positive X direction of the magnetic sensor unit 1. The third side surface 4c is located in the negative Y direction of the magnetic sensor unit 1. The fourth side surface 4d is located in the positive Y direction of the magnetic sensor unit 1. The bottom surface 4e is located in the negative Z direction of the magnetic sensor unit 1.

As shown in FIGS. 1 to 3, the first side surface 4a and the second side surface 4b extend in the longitudinal direction and face each other with the magnet 3 between the first and second side surfaces. The third side surface 4c and the fourth side surface 4d extend in the lateral direction intersecting with the longitudinal direction, and face each other with the magnet 3 between the third and fourth side surfaces. The bottom surface 4e is located opposite to the sensing target 2 relative to the magnetic sensor unit 1 and extends in the longitudinal direction. The first side surface 4a and the second side surface 4b are contiguous with the third side surface 4c and the fourth side surface 4d and with the bottom surface 4e.

A magnetic shield unit of the present disclosure is not limited to the above described magnetic shield unit 4 having five surfaces and may have other structures if the magnetic shield unit of the present disclosure is a box-shaped magnetic shield made with a magnetic material. The magnetic shield unit 4 is a box-shaped magnetic shield that has an opening 4o at a position facing the sensing target 2 and that supports or contains the magnetic sensor unit 1. As shown in FIG. 3, the opening 4o of the magnetic shield unit 4 is a rectangular opening defined by two long sides in the longitudinal direction and two short sides in the lateral direction. The opening 4o is given the reference numeral only in FIGS. 3, 6A, and 6B and is not given the reference numeral in the other figures.

As shown in FIGS. 1 and 2, the cover 5 is a shield cover disposed between the magnetic sensor unit 1 and the sensing target 2 to cover the magnetic shield unit 4. The cover 5 is made with a non-magnetic material and plays a role of electrical shielding. The cover 5 enables a magnetic field to pass through. When the sensing target 2 is in contact with the cover 5, the transport surface is the surface of the cover 5. In this case, the origin of Z-axis defined on the transport surface is a point on the surface of the cover 5. A direction from the cover 5 toward the sensing target 2 is the positive direction along Z-axis (positive Z direction), and a direction toward the magnetic sensor unit 1 is the negative direction along Z-axis (negative Z direction).

A housing 6 is a case containing or holding the magnetic sensor unit 1 containing the magnet 3. There is no need for the magnetic sensor device 10 to separately include the housing 6. In this case, for example, the magnetic shield unit 4 may serve as the housing 6.

The magnetic sensor device 10 according to Embodiment 1 is now described in detail. As shown in FIGS. 1 and 2, the cover 5 is disposed adjacent to the transport surface for the sensing target 2 or is a member constituting the transport surface. The cover 5 is a flat plate extending in Y-axis direction (width reading direction or longitudinal direction) and has sloped ends in the positive and negative X directions (transport direction or lateral direction). The cover 5 has a shape by which the cover 5 covers a portion of the upper outer surface of the housing 6 in Z-axis direction (height direction) such that the portion of the upper outer surface of the housing 6 is located vertically above the magnetoresistive element 1a.

The housing 6 is shaped like a box that opens toward the transport surface in Z-axis direction (height direction) and has an opening for containing or holding each of the components of the magnetic sensor device 10 according to Embodiment 1, holes for positioning each of the components, and a mounting surface. More specifically, the housing 6 has a stepped portion 6a supporting a sensor board 1b, a first opening 6b nearest to the transport surface, a second opening 6c communicating with the first opening 6b, and a recess 6d formed on a side surface. The first opening 6b is covered by the cover 5. The cover 5 is fixed to a portion around the first opening 6b. The length of the first opening 6b in the lateral direction is longer than the length of the second opening 6c in the lateral direction. The difference between the lengths of the first opening 6b and the second opening 6c in the lateral direction forms a step, and a portion of the step around the second opening 6c is the stepped portion 6a. Preferably, the first opening 6b and the second opening 6c are rectangular openings.

The sensing element included in the magnetic sensor unit 1 is any sensing element to detect a magnetic component. One example of the sensing element is the magnetoresistive element 1a. The magnetic sensor unit 1 further includes the sensor board 1b, a wire 1c, a mount 1d, and an external connector 1e. The magnetoresistive element 1a and the sensor board 1b extend in Y-axis direction. In other words, the magnetic sensor unit 1 extends in Y-axis direction.

As shown in FIGS. 1 and 2, the sensor board 1b is located between the cover 5 and the magnet 3 in Z-axis direction and extends in Y-axis direction. The sensor board 1b may be a single plate extending in Y-axis direction as or may be a set of separate plates extending in Y-axis direction. The sensor board 1b has the magnetoresistive element 1a that is mounted on the surface opposite to the surface facing the magnet 3. The sensor board 1b includes the mount 1d for mounting the magnetoresistive element 1a and the external connector 1e for transmitting an electrical signal from the magnetoresistive element 1a to an external device. The mount 1d is formed on the surface of the sensor board 1b in the positive direction along Z-axis, where the surface of the sensor board 1b in the positive direction along Z-axis faces the transport path.

As shown in FIG. 1, the magnetoresistive element 1a is fixed to and mounted on the mount 1d of the sensor board 1b with, for example, an adhesive. The position of the magnetoresistive element 1a on the mount 1d in X-axis direction and Y-axis direction is determined in accordance with an intended position of the sensing portion of the magnetic sensor device 10. The magnetoresistive element 1a detects a change in a component of a magnetic field in the transport direction (bias magnetic field) generated by transporting the sensing target 2 containing a magnetic component in the transport direction. More specifically, when the resistance value of the magnetoresistive element 1a changes, an output signal from the magnetoresistive element 1a changes accordingly. The magnetoresistive element 1a uses the component of the magnetic field emitted by the magnet 3 in the transport direction as a bias magnetic field.

As shown in FIG. 1, the sensor board 1b is electrically connected to the magnetoresistive element 1a through the wire 1c. A surface of the sensor board 1b on the negative direction side of Z axis that is a surface facing the magnet 3 partially is in contact with the stepped portion 6a of the housing 6. The surface of the sensor board 1b that is in contact with the stepped portion 6a is fixed with an adhesive. At this point of time, the stepped portion 6a is positioned in Z-axis direction to position the sensor board 1b in Z-axis direction. The sensor board 1b may be positioned in X-axis direction and Y-axis direction by fitting the sensor board 1b into the first opening 6b of the housing 6. In this case, the shape of the first opening 6b may be the same as the contour of the sensor board 1b, or alternatively a portion of the shape of the first opening 6b may include a structure for fixing the sensor board 1b.

The magnet 3 extends in Y-axis direction and is shaped like a rod. The magnet 3 is fixed with an adhesive to the surface of the sensor board 1b opposite to the surface on which the magnetoresistive element 1a is mounted. In other words, the magnet 3 is fixed on the surface of the sensor board 1b in the negative direction along Z-axis. The magnet 3 is disposed in the second opening 6c. The magnet 3 is disposed parallel to the magnetoresistive element 1a. The magnet 3 is positioned in Z-axis direction (height direction) by making the magnet 3 come into contact with the surface of the sensor board 1b opposite to the surface on which the magnetoresistive element 1a is mounted. The magnet 3 and the magnetoresistive element 1a are fixed at positions at which the center of the magnet 3 in X-axis direction matches the center of the magnetoresistive element 1a in X-axis direction.

The magnet 3 may be a single magnet extending in Y-axis direction or may be a set of separate magnets extending in Y-axis direction. The magnet 3 generates a magnetic field to apply a bias magnetic field to the magnetoresistive element 1a. In this state, the sensing target 2 is transported on the transport path to change the magnitude of the bias magnetic field. The change in the bias magnetic field causes a change in the resistance value of the magnetoresistive element 1a, and then causes a change in the detection signal output from the magnetoresistive element 1a. A change in the position of the magnet 3 in X-axis direction causes a change in the magnetic force of the magnetic field emitted by the magnet 3 acting on the magnetoresistive element 1a and the sensing target 2. Accordingly, the position of the magnet 3 in X-axis direction is adjusted finely in accordance with the performance of the magnetic sensor device 10.

As shown in FIG. 1, the cover 5 covers a portion of the upper outer surface of the housing 6 in Z-axis direction such that the portion of the upper outer surface of the housing 6 is located vertically above the magnetoresistive element 1a. In other words, the cover 5 covers the surface of the sensor board 1b on which the magnetoresistive element 1a is mounted. As shown in FIGS. 1 and 2, the cover 5 includes a flat transport surface portion 5b formed along X-axis direction and a pair of tapered portions 5a sloping in the negative Z direction from the both ends of the transport surface portion 5b in X-axis direction, when the magnetic sensor device 10 is viewed along Y-axis direction. The pair of tapered portions 5a and the transport surface portion 5b extends in Y-axis direction.

In the cover 5, the transport surface portion 5b and the pair of tapered portions 5a are formed integrally by bending a thin metal plate. The cover 5 is mounted on the surface of the housing 6 facing the transport path. Since the cover 5 includes the tapered portions 5a each of which serves as a transport guide, the sensing target 2 is transported along the tapered portions 5a and an effect of preventing the sensing target 2 from being transported in directions deviating from X-axis direction can be obtained. However, there is no need for the cover 5 to necessarily includes the tapered portions 5a. The tapered portions 5a are formed or omitted in accordance with the transport situation for the sensing target 2 and the surrounding environment of the magnetic sensor device 10.

The cover 5 protects the magnetoresistive element 1a against impact and wear caused by the sensing target 2 hitting or being rubbed against particularly the magnetoresistive element 1a in the magnetic sensor device 10 when the sensing target 2 is transported on the transport surface of the magnetic sensor device 10 or on the transport surface formed above the magnetic sensor device 10. Since the cover 5 is located between the sensing target 2 and the magnetoresistive element 1a, it is preferable that the cover 5 is made with a non-magnetic material so that the cover 5 has no influence on the magnetism-sensing performance of the magnetic sensor device 10. The non-magnetic material is, for example, non-magnetic metal such as aluminum, ceramic, or resin. The cover 5 is prepared by bending a thin plate of metal (e.g., aluminum). The cover 5 may be made with another material and using another method.

As shown in FIG. 1, the housing 6 is a member that contains or holds the sensor board 1b and the magnet 3 that are components other than the cover 5 and the magnetic shield unit 4. The housing 6 is made with an electrically conductive material. For example, the housing 6 is made with metal such as aluminum, or electrically conductive resin. The housing 6 has the first opening 6b for positioning the sensor board 1b in X-axis direction and Y-axis direction. The first opening 6b is a recess formed to be concave in the negative direction along Z-axis from the mounting surface of the housing 6 through which the housing 6 is attached to the cover 5. The stepped portion 6a on which the sensor board 1b is placed is formed at the bottom of the recess in the negative Z direction and the stepped portion 6a supports the sensor board 1b in Z-axis direction.

The housing 6 further has the second opening 6c that is a recess formed to be concave in the negative Z direction relative to the stepped portion 6a. The length of the second opening 6c in X-axis direction is smaller than the length of the first opening 6b in X-axis direction. The second opening 6c receives the magnet 3, and the position of the magnet 3 in X-axis direction and Y-axis direction can be fixed by the second opening 6c. The housing 6 further has the slot 6d extending in the negative Z direction between the housing 6 and the second side surface 4b of the magnetic shield unit 4. The slot 6d is a path for disposing the external connector 1e that outputs a signal detected by the magnetic sensor unit 1 from the sensor board 1b mounted on the stepped portion 6a to the outside. The slot 6d is formed in a portion of a side surface of the housing 6 extending Y-axis direction.

The housing 6 further has mounting holes for fastening fasteners 7 in order that the magnetic shield unit 4 is fixed to the housing 6. The mounting holes are formed on two areas of the surface of the housing 6 in the negative direction along Z-axis, where the two areas of the surface of the housing 6 in the negative direction along Z-axis are spaced apart from each other in Y-axis direction. The fasteners 7 are, for example, a screw. The magnetic shield unit 4 has two mounting holes that are formed at positions at which the two mounting holes are aligned with the mounting holes of the housing 6. The magnetic shield unit 4 further has a hole 4h that is formed at a position on the bottom surface 4e corresponding to the slot 6d of the housing 6. The external connector 1e is pulled out through this hole 4h to the outside of the magnetic sensor device 10.

As shown in FIG. 1, the first opening 6b of the housing 6 also provides a space for preventing the cover 5 from coming into contact with the magnetoresistive element 1a and the wire 1c. The housing 6 also releases heat generated by the magnetoresistive element 1a out of the magnetic sensor device 10. The housing 6 may be formed from a non-magnetic material including, for example, aluminum that has no influence on a magnetic field. The housing 6 is made with any material and using any method. For example, the housing 6 may be formed by cutting aluminum.

As shown in FIGS. 1, 2, and 3, the bottom surface 4e of the magnetic shield unit 4 is formed to extend in X-axis direction when the magnetic sensor device 10 is viewed in Y-axis direction. The bottom surface 4e faces the bottom surface of the housing 6. When the magnetic sensor device 10 is viewed in Y-axis direction, the first side surface 4a and the second side surface 4b of the magnetic shield unit 4 are a pair of side surfaces that extend in the positive Z direction from the both ends of the bottom surface 4e in X-axis direction. The first side surface 4a, the second side surface 4b, and the bottom surface 4e extend in Y-axis direction.

As shown in FIGS. 1, 2, and 3, when the magnetic sensor device 10 is viewed in X-axis direction, the third side surface 4c and the fourth side surface 4d of the magnetic shield unit 4 are a pair of side surfaces that extend in the positive Z direction from the both ends of the bottom surface 4e in Y-axis direction. The third side surface 4c, the fourth side surface 4d, and the bottom surface 4e extend in X-axis direction.

The bottom surface 4e has a planar shape in FIGS. 1, 2, and 3. The first side surface 4a, the second side surface 4b, the third side surface 4c, and the fourth side surface 4d also have planar shapes. In other words, the magnetic shield unit 4 has a shape that is such that the magnetic shield unit 4 is open in the positive direction along the Z-axis with respect to the bottom surface 4e. It is desirable that the length of the magnetic shield unit 4 in Y-axis direction is equal to or larger than at least the lengths of the magnet 3 and the sensor board 1b in Y-axis direction.

The housing 6 is located in the internal space of the magnetic shield unit 4 surrounded by the bottom surface 4e, the first side surface 4a, the second side surface 4b, the third side surface 4c, and the fourth side surface 4d of the magnetic shield unit 4. The magnetic shield unit 4 is fixed to the housing 6 either with the fasteners 7 or with an adhesive. In other words, the housing 6 is covered by the magnetic shield unit 4 except the opening portion to which the sensor board 1b is fixed. In FIG. 1, the bottom surface 4e of the magnetic shield unit 4 and the surface of the housing 6 in the negative Z direction are fastened by the fasteners 7 and fixed to each other. The bottom surface 4e, the first side surface 4a, the second side surface 4b, the third side surface 4c, and the fourth side surface 4d of the magnetic shield unit 4 may be formed separately and then joined together with an adhesive, or may be formed integrally by bending a thin metal plate or by extruding a block material.

As shown in FIGS. 1, 2, and 3, the magnetic shield unit 4 is fixed to the housing 6 with the fasteners 7 to be positioned in Z-axis direction. The magnetic shield unit 4 is positioned in X-axis direction and Y-axis direction by aligning the two mounting holes in the bottom surface 4e of the magnetic shield unit 4 with the two corresponding mounting holes in the bottom of the housing 6. The fasteners 7 are fastened in the two mounting holes. The magnetic shield unit 4 and the housing 6 are further fastened to each other using a through-hole 4i on the third side surface 4c or in the fourth side surface 4d and two mounting holes on the side surface of the housing 6. The through-hole 4i is shown only in FIGS. 2, 3, and 6A and is omitted in the other drawings.

As shown in FIGS. 1 and 3, in the vicinity of the center of the magnetic shield unit 4 in the longitudinal direction, the edges of the first side surface 4a and the second side surface 4b in Z-axis direction are equal to the position of the surface of the sensor board 1b including the mount 1d in Z-axis direction or are higher than the position of the mount 1d in the positive Z direction. In other words, the surface of the sensor board 1b including the mount 1d is the surface of the sensor board 1b facing in the positive direction along Z-axis.

Also, the edges of the first side surface 4a and the second side surface 4b of the magnetic shield unit 4 in Z-axis direction are located at a position at least equal to the position of the surface of the sensor board 1b opposite to the surface including the mount 1d. In other words, the surface of the sensor board 1b opposite to the surface including the mount 1d is the surface of the sensor board 1b facing in the negative direction along Z-axis. It is desirable that the edges of the first side surface 4a and the second side surface 4b of the magnetic shield unit 4 in Z-axis direction are located at positions in the positive Z direction from the surface of the sensor board 1b opposite to the surface including the mount 1d. In this case, the magnetic shield unit 4 covers an area extending in the negative Z direction from the position of the surface of the sensor board 1b facing the magnet 3.

Figure 4A:
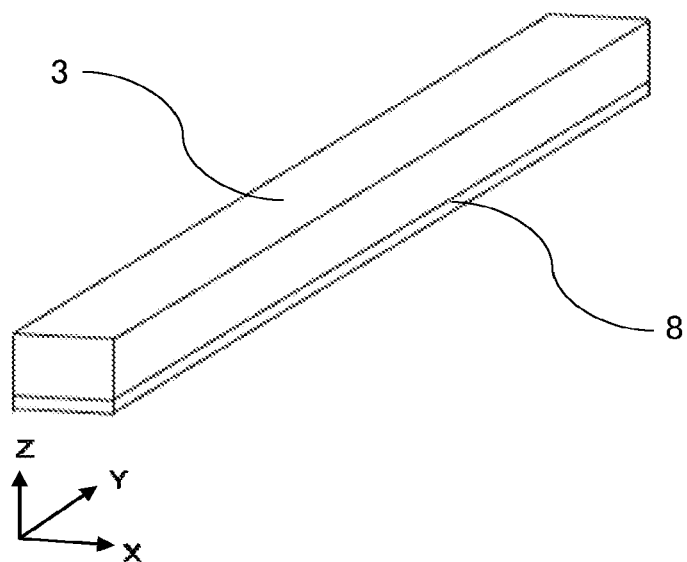
FIG. 4A is a perspective view of a magnetic sensor device of a comparative example against the magnetic sensor device according to Embodiment 1 of the present disclosure.
Figure 4B:
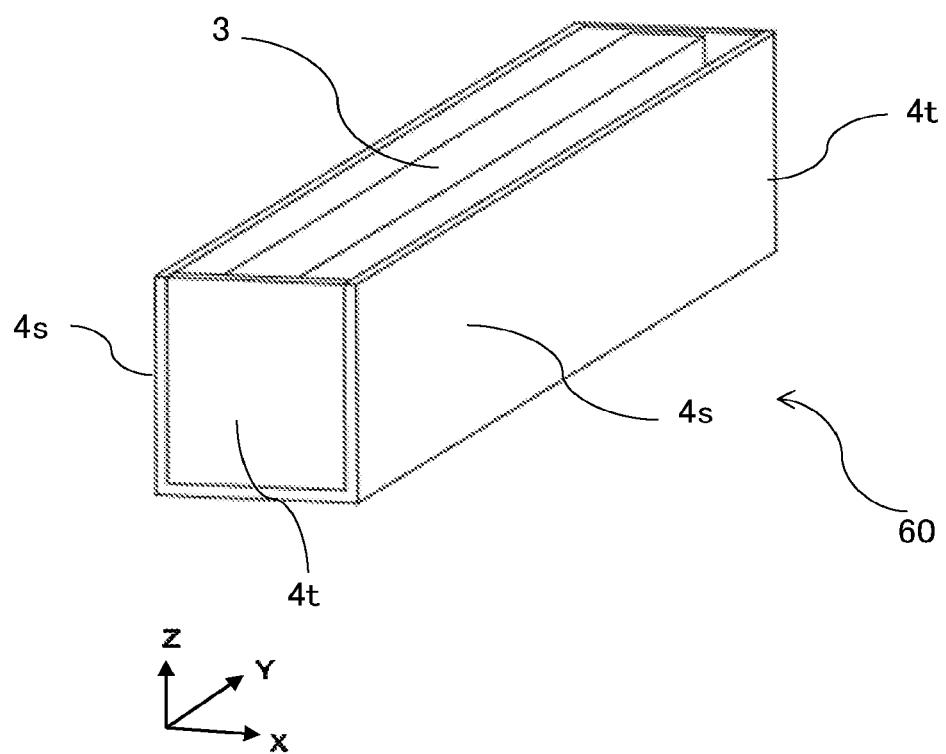
FIG. 4B is a perspective view of the magnetic sensor device of the comparative example against the magnetic sensor device according to Embodiment 1 of the present disclosure.

The features of the magnetic sensor device 10 according to Embodiment 1 are described with reference to FIGS. 4A to 5C. FIG. 4A is a perspective view of a magnet 3 and a bottom yoke 8 in a magnetic sensor device 60 of a comparative example against the magnetic sensor device 10 according to the present embodiment. FIG. 4B is a perspective view of the magnetic sensor device 60 of a comparative example. In order to facilitate understanding of the structure of the magnetic sensor device 60, a magnetic sensor unit 1, a cover 5, and a housing 6 are not shown.

As shown in FIG. 4B, the magnetic sensor device 60 of the comparative example has a structure in which the edges of side surfaces 4s of a magnetic shield unit 4 in the longitudinal direction and the edges of side surfaces 4t of the magnetic shield unit 4 in the lateral direction are located at the same level as the upper surface of the magnet 3 and the magnet 3 is disposed in the center of the magnetic shield unit 4 in X-axis direction. In this example, the magnet 3 has a profile with a width-height-length ratio of 3:2:60 and the bottom yoke 8 as a magnetic yoke is disposed on the bottom surface of the magnet 3. Except for the height of the bottom yoke 8, the bottom yoke 8 has the same dimensions as the magnet 3. The height ratio is 1:4 and the magnet 3 is higher than the bottom yoke 8. The magnetic bottom yoke 8 of magnetic material is made with a material with high magnetic permeability and high thermal conductivity, such as iron, silicon steel, or magnetic stainless steel. The magnetic bottom yoke 8 is integrally molded with the magnet 3 or fixed to the magnet 3 with an adhesive. The magnetic shield unit 4 shown in FIG. 4B is made with an iron material and has a width-height-length ratio of 8:9:82. The gaps in Y-axis direction between the magnet 3 and the magnetic shield unit 4 have the same thickness as the thickness of the iron material for the magnetic shield unit 4. In the magnetic sensor device 60 of the comparative example, the height of each side surface 4s at the central portion of each side surface 4s in the longitudinal direction is equal to the heights of each side surface 4s at the ends of each side surface 4s in the longitudinal direction.

Figure 5A:
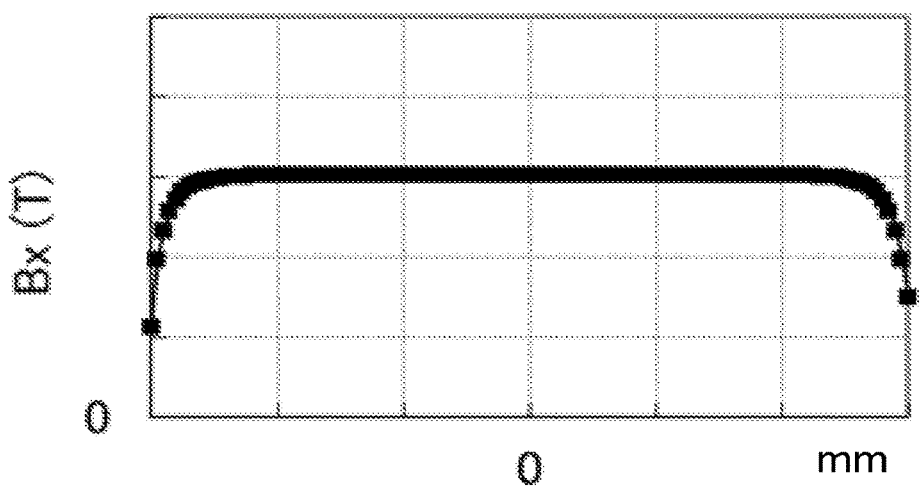
FIG. 5A is a graph showing the distribution of magnetic flux density in X-axis direction in the magnetic sensor device of the comparative example against the magnetic sensor device according to Embodiment 1 of the present disclosure.
Figure 5B:
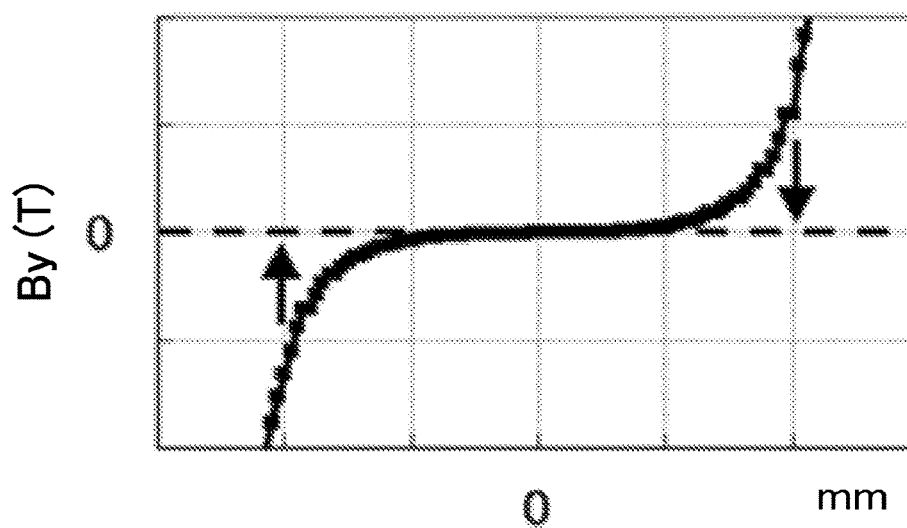
FIG. 5B is a graph showing the distribution of magnetic flux density in Y-axis direction in the magnetic sensor device of the comparative example against the magnetic sensor device according to Embodiment 1 of the present disclosure.
Figure 5C:
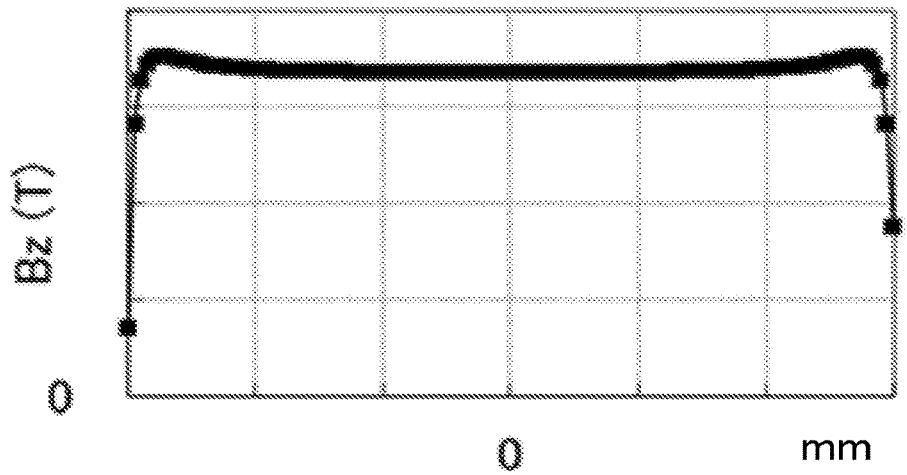
FIG. 5C is a graph showing the distribution of magnetic flux density in Z-axis direction in the magnetic sensor device of the comparative example against the magnetic sensor device according to Embodiment 1 of the present disclosure.

FIGS. 5A, 5B, and 5C are graphs each showing the distribution of magnetic flux density depending on the position of the magnetoresistive element 1a placed on the magnet 3 in the magnetic sensor device 60 of the comparative example shown in FIGS. 4A and 4B. FIG. 5A shows a magnetic flux density Bx in X-axis direction. FIG. 5B shows a magnetic flux density By in Y-axis direction. FIG. 5C shows a magnetic flux density Bz in Z-axis direction. In FIGS. 5A, 5B, and 5C, the vertical axis indicates the value in teslas (T), and the horizontal axis indicates the position in Y-axis direction in millimeters (mm).

The origin of Y-axis direction is defined as the center of the magnet 3 in FIGS. 5A, 5B, and 5C. The value Bx is within a certain range except the both ends of the magnet 3 and decreases toward the both ends of the magnet 3. The value By is almost 0 in the vicinity of the origin, increases toward the end on the positive side of Y-axis and decreases toward the end on the negative-side of Y-axis. The value Bz is within a certain range in the vicinity of the origin and increases toward the two ends of the magnet 3 once and then greatly drops toward the two ends of the magnet 3. The sensitivity of the magnetic sensor device 60 to an external magnetic flux, is influenced by the values Bx and By, and, in this case, the value By has a large influence on the sensitivity of the magnetic sensor device 60 to an external magnetic flux. To obtain a long area with uniform sensitivity, it is desirable that the value By is decreased in the positive area in Y-axis direction and increased in the negative area in Y-axis direction as indicated by the arrows in FIG. 5B.

Figure 6A:
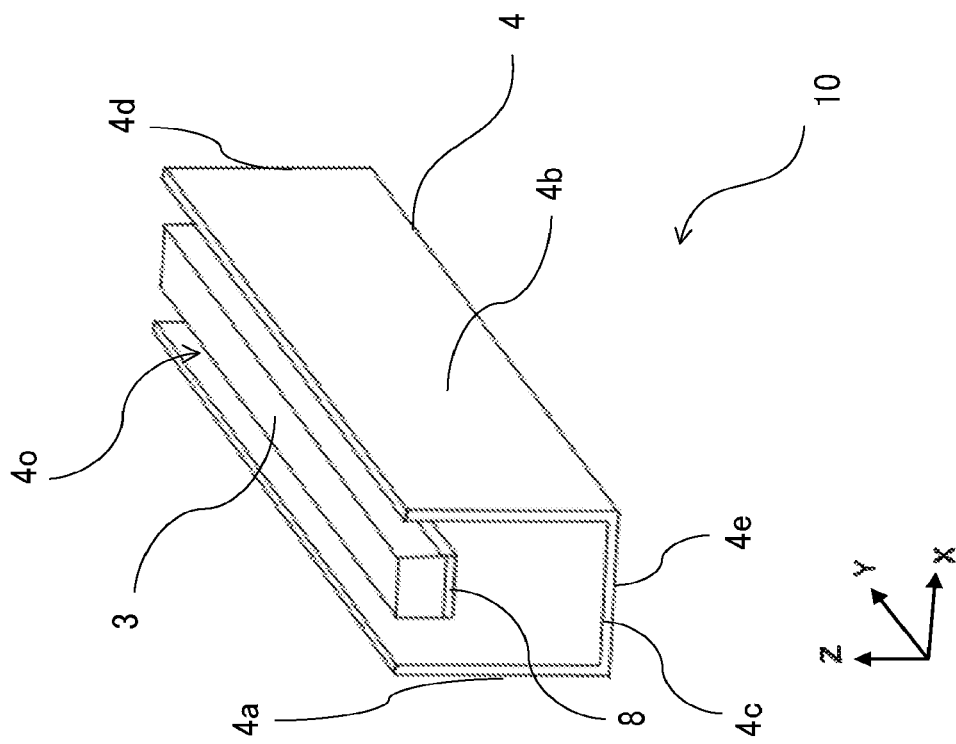
FIG. 6A is a perspective view of the magnetic sensor device according to Embodiment 1 of the present disclosure.
Figure 6B:
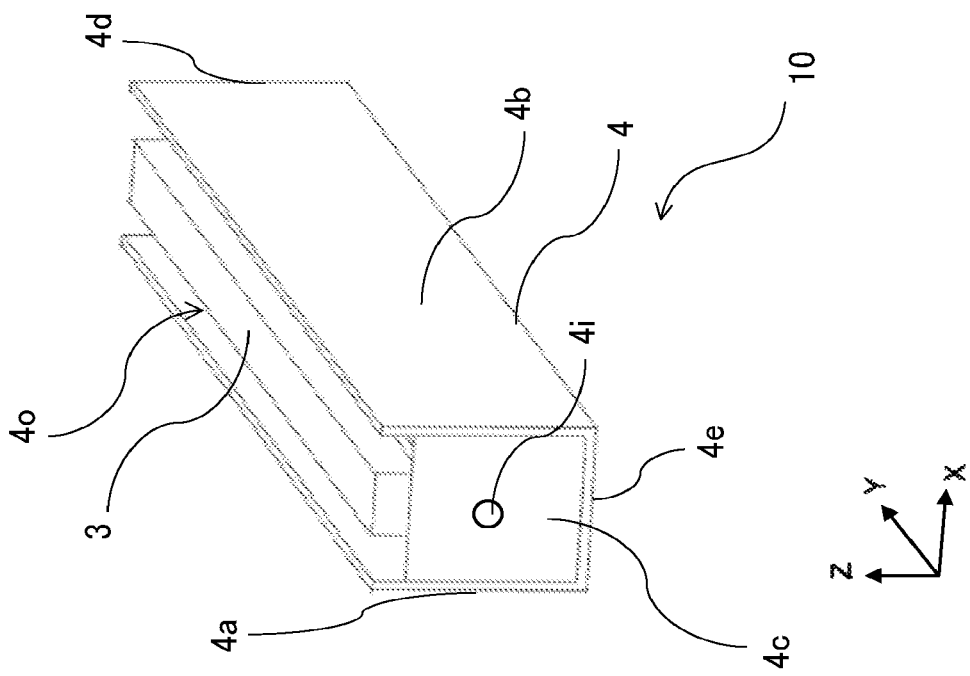
FIG. 6B is a perspective view of the magnetic sensor device according to Embodiment 1 of the present disclosure.

FIGS. 6A and 6B are perspective views of the magnetic sensor device 10 according to the present embodiment. The cover 5 is not shown in FIGS. 6A and 6B. The opening 4o of the magnetic shield unit 4 has two long sides in the longitudinal direction and two short sides in the lateral direction in FIGS. 6A and 6B. In the magnetic shield unit 4, a difference in level is made at portions at which the two long sides are contiguous to the two short sides. The two long sides are nearer to the sensing target 2 in Z-axis direction than the two short sides are.

In other words, in the magnetic shield unit 4 shown in FIGS. 6A and 6B, the smallest length of the lengths of the third side surface 4c and the fourth side surface 4d in Z-axis direction is smaller than the largest length of the lengths of the first side surface 4a and the second side surface 4b in Z-axis direction.

The two short sides shown in FIG. 6A are nearer to the sensing target 2 in Z-axis direction than the two short sides shown in FIG. 6B are. The heights of both the third side surface 4c and the fourth side surface 4d shown in FIGS. 6A and 6B are lower than the heights of the first side surface 4a and the second side surface 4b and the levels of the ends of the magnet 3. The third side surface 4c and the fourth side surface 4d shown in FIG. 6A are higher than the third side surface 4c and the fourth side surface 4d shown in FIG. 6B.

Figure 7:
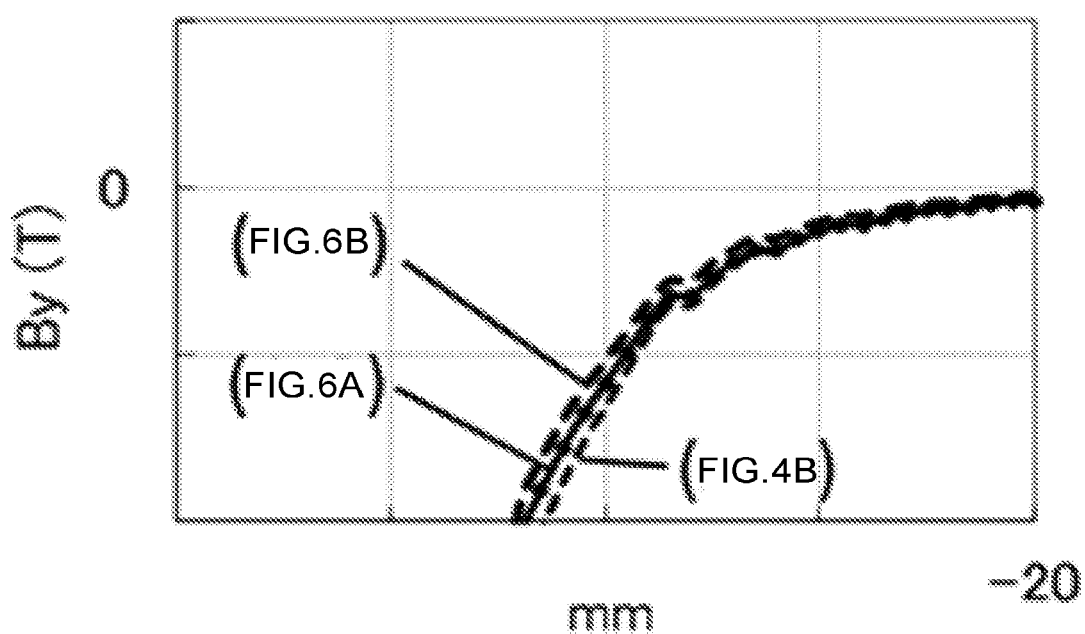
FIG. 7 is a graph showing the distribution of magnetic flux density in Y-axis direction in the magnetic sensor device according to Embodiment 1 of the present disclosure.

FIG. 7 is a graph showing changes in the magnetic flux density By in the longitudinal direction (Y-axis direction) detected by the magnetoresistive element 1a in the magnetic sensor devices 10 and 60 shown in FIGS. 4B, 6A, and 6B. The drawing numbers of the magnetic sensor devices 10 and 60 corresponding to curves are described near to ends of the leader lines drawn from the curves indicating changes in the magnetic flux density By.

In FIG. 7, the vertical axis indicates the value in teslas (T), and the horizontal axis indicates the value in millimeters (mm). The horizontal axis indicates the position in Y-axis direction, and FIG. 7 is an enlarged view of the area for positions in the negative direction along Y-axis. An amount of a reduction in the magnetic flux density By at the end in Y-axis direction relative to the origin of Y-axis decreases as the height of the third side surface 4c or the fourth side surface 4d decreases. This means that an effect of attracting the magnetic flux of the magnet 3 by the third side surface 4c and the fourth side surface 4d becomes small. Thus, lowering the height of the third side surface 4c or the height of the fourth side surface 4d achieves uniform magnetic flux density By in the longitudinal direction. However, a reduction in the height of the third side surface 4c or the height of the fourth side surface 4d reduces the shielding effect against an external magnetic flux.

As described above, the heights of the third side surface 4c and the fourth side surface 4d of the magnetic shield unit 4 are lower than the center of the first side surface 4a and the second side surface 4b in the longitudinal direction in the magnetic sensor device 10 according to the present embodiment. This structure causes (i) a reduction in an influence on the performance of magnetic sensor device 10 exerted by a change in the external magnetic field from the outside of the magnetic sensor device 10 and (ii) an enlargement of an area in which a magnetic flux in the longitudinal direction is small at the ends in the longitudinal direction, so that uniform sensitivity of anisotropic magnetoresistive elements is easily achieved. Accordingly, the multiple sensing elements (preferably, anisotropic magnetoresistive elements) in the magnetic sensor unit 1 can be made to stably output signals of substantially the same level.

As described above, the magnetic sensor device 10 according to the present embodiment includes the magnetic sensor unit 1 including the magnetoresistive element 1a mounted on the sensor board 1b extending in the longitudinal direction and the magnet 3 located on the surface of the sensor board 1b opposite to the surface on which the magnetoresistive element 1a is mounted, the housing 6 supporting the magnetic sensor unit 1, the magnetic shield unit 4 covering the side surfaces and the bottom surface of the housing 6, and the cover 5 covering the upper portion of the housing 6. The magnetic shield unit 4 has the opening 4o facing in Z-axis direction from the magnetoresistive element 1a toward the sensing target 2. The opening 4o has two long sides in the longitudinal direction and two short sides in the lateral direction. In the magnetic shield unit 4, the difference in level is made at the portions at which the two long sides are contiguous to the two short sides. The two long sides are nearer to the sensing target 2 in Z-axis direction than the two short sides are. Accordingly, a reduction in the sensitivity of the magnetic sensor unit 1 at the ends in the longitudinal direction perpendicular to the transport direction of the sensing target can be suppressed and the magnetic shielding effect can be also obtained.

Embodiment 2

A magnetic sensor device 20 according to Embodiment 2 of the present disclosure is described with reference to FIGS. 8A, 8B, and 9. The same or corresponding components are given the same reference numerals in these drawings together with other drawings for the other embodiments. The magnetic sensor device 20 includes a magnetic sensor unit 1 containing a magnet 3, a magnetic shield unit 4, a housing 6, and a cover 5. The magnetic sensor unit 1 detects a magnetic component of a sensing target 2. The magnetic sensor unit 1, the housing 6, and the cover 5 have the same structures and functions as described in Embodiment 1.

Figure 8A:
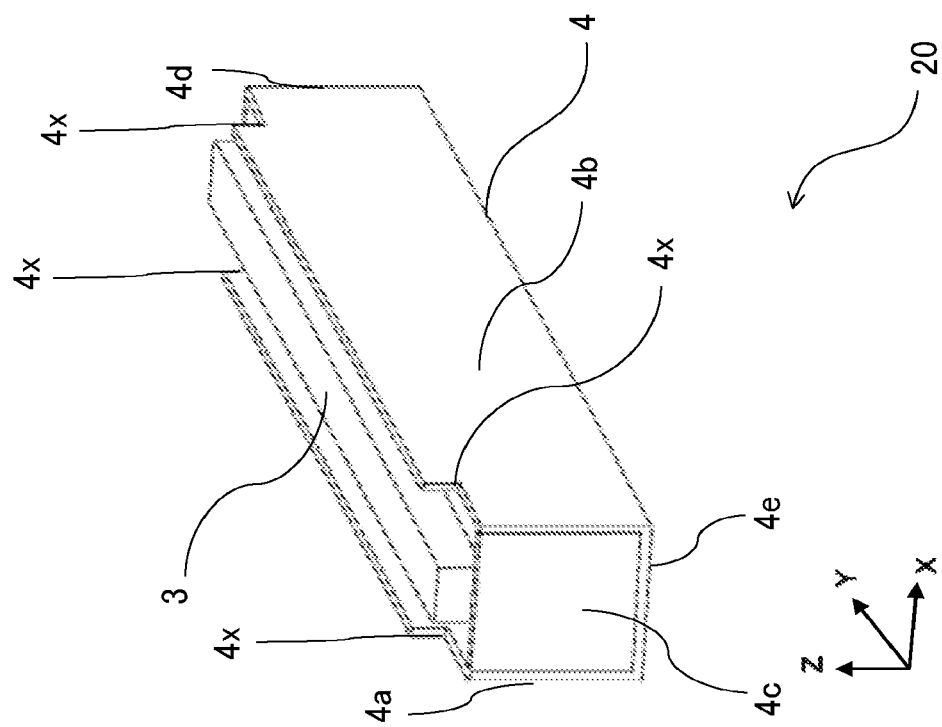
FIG. 8A is a perspective view of a magnetic sensor device according to Embodiment 2 of the present disclosure.
Figure 8B:
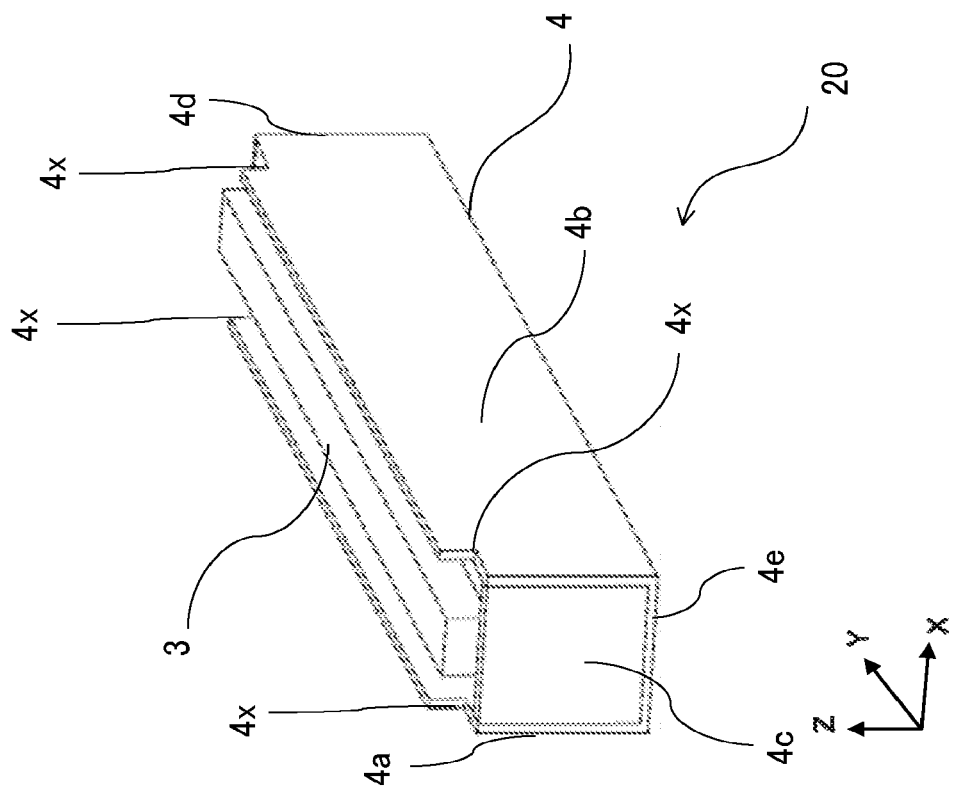
FIG. 8B is a perspective view of the magnetic sensor device according to Embodiment 2 of the present disclosure.

FIGS. 8A and 8B are perspective views of the magnetic sensor device 20 according to Embodiment 2. In order to facilitate understanding of the structure of the magnetic sensor device 20, the magnetic sensor unit 1, the cover 5, and the housing 6 are not shown. The structures shown in FIGS. 8A and 8B differ from each other in a part of the magnetic shield unit 4.

In FIGS. 8A and 8B, steps 4x are stepped portions formed in the first side surface 4a and the second side surface 4b. In other words, the first side surface 4a has a shape in which a portion around at least one of vertices facing the sensing target 2 is cut out from the rectangular surface extending in the longitudinal direction. In other words, the notch-shaped step 4x is formed at at least one of the vertices of the first side surface 4a facing the sensing target 2. Similarly, the second side surface 4b has a shape in which a portion around at least one of vertices facing the sensing target 2 is cut out and thus the second side surface 4b also has the step 4x. The cover 5 covers the step 4x, although the magnetic sensor unit 1, the cover 5, and the housing 6 are not shown in FIGS. 8A and 8B. It is desirable that the steps 4x have such a small size as can still serve as a magnetic shield.

As for the steps 4x, the magnetic shield unit 4 has an opening 4o having the two long sides and two short sides, and a stepped portion is formed in an area ranging from a boundary between each long side and each short side to the center of the long side such that the stepped portion rises in Z-axis direction. The stepped portion allows the two long sides to rise in the positive direction along Z-axis.

The third side surface 4c of the magnetic shield unit 4 shown in FIGS. 8A and 8B is contiguous to the first side surface 4a and the second side surface 4b. The lengths of the contiguous portions of the third side surface 4c in Z-axis direction are equal to the length of the contiguous portion of the first side surface 4a in Z-axis direction and the length of the contiguous portion of the second side surface 4b in Z-axis direction. The fourth side surface 4d of the magnetic shield unit 4 is contiguous to the first side surface 4a and the second side surface 4b, and the lengths of the contiguous portions of the fourth side surface 4d in Z-axis direction are equal to the length of the contiguous portion of the first side surface 4a in Z-axis direction and the length of the contiguous portion of the second side surface 4b in Z-axis direction, although such a relationship between the fourth side surface 4d and the first and second side surfaces 4a and 4b can not be viewed in FIGS. 8A and 8B.

In the magnetic sensor device 20 shown in FIGS. 8A and 8B, the heights of the third side surface 4c and the fourth side surface 4d are lower than the levels of the upper ends of the magnet 3, and the levels of the center portions of the first side surface 4a and the second side surface 4b are equal to the levels of the upper ends of the magnet 3. Only the level of the ends of first side surface 4a or the second side surface 4b in the longitudinal direction is lower than the levels of the upper ends of the magnet 3, and the level of the ends of first side surface 4a or the second side surface 4b in the longitudinal direction is equal to the height of the third side surface 4c and the fourth side surface 4d. The lengths of the lower level portions of the ends of the first side surface 4a and the second side surface 4b shown in FIG. 8A in Y-axis direction are half of the lengths of the lower level portions of the ends of the first side surface 4a and the second side surface 4b shown in FIG. 8B in Y-axis direction.

Figure 9:
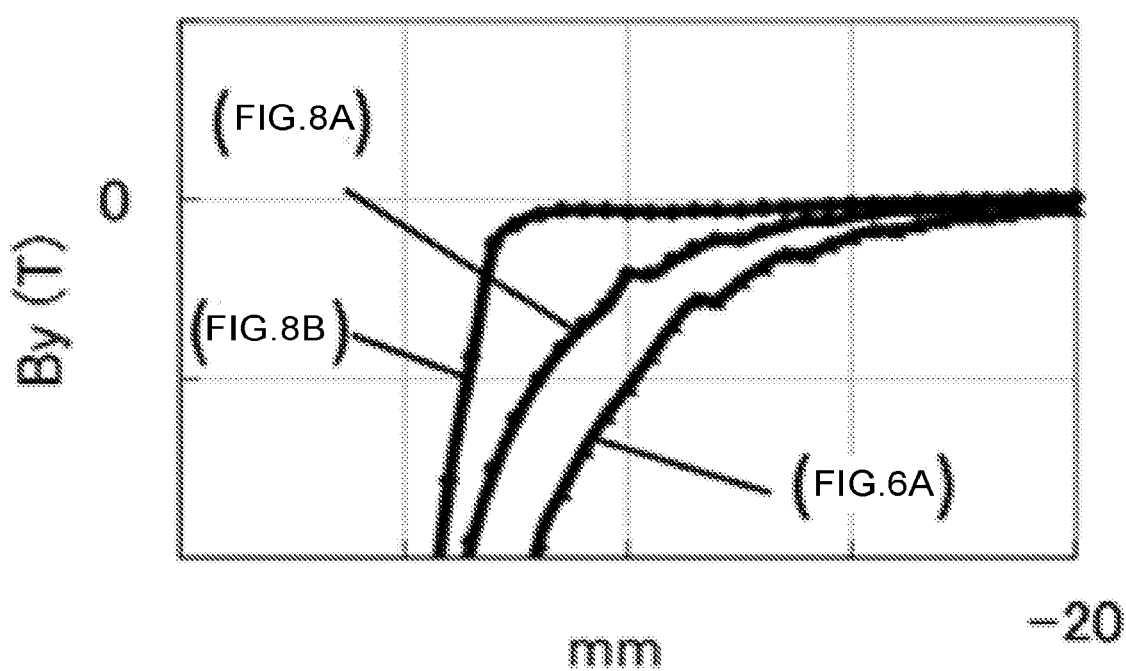
FIG. 9 is a graph showing the distribution of magnetic flux density in Y-axis direction in the magnetic sensor device according to Embodiment 2 of the present disclosure.

FIG. 9 is a graph showing the distribution of the magnetic flux density By in Y-axis direction depending on the position of the magnetoresistive element 1a placed on the magnet 3 in the magnetic sensor devices 10 and 20 shown in FIGS. 6A, 8A, and 8B. That is, FIG. 9 is a graph comparing the magnetic flux densities By in Y-axis direction depending on the position of the magnetoresistive element 1a under three conditions. The drawing numbers of the magnetic sensor devices 10 and 20 corresponding to curves are described near to ends of the leader lines drawn from the curves indicating changes in the magnetic flux density By.

In FIG. 9, the vertical axis indicates the value in teslas (T), and the horizontal axis indicates the value in millimeters (mm). The horizontal axis indicates the position in Y-axis direction, and FIG. 9 is an enlarged view of the area for positions in the negative direction along Y-axis.

As shown in FIG. 9, the magnetic flux density By at the ends of the first side surface 4a and the second side surface 4b in Y-axis direction approaches zero when the step 4x has a larger length in Y-axis direction. In other words, this means that an effect of attracting the magnetic flux of the magnet 3 to the ends of the first side surface 4a and the second side surface 4b in the longitudinal direction becomes small. That is, an increase in the length of the step 4x in Y-axis direction causes an increase in an effect of uniforming the magnetic flux density By in the longitudinal direction. In other words, in the first side surface 4a and the second side surface 4b, it is concluded that the degree to which portions other than the step 4x attract the magnetic flux of the magnet 3 in the longitudinal direction is greater than the degree to which the step 4x attracts the magnetic flux of the magnet 3 in the longitudinal direction. Accordingly, the magnetic sensor device 20 can be obtained that have uniform sensitivity in a wide area in the longitudinal direction of the magnetic sensor unit 1 and can suppress an influence exerted by an external magnetic flux.

As described above, the magnetic shield unit 4 in the magnetic sensor device 20 according to the present embodiment includes the first side surface 4a and the second side surface 4b extending in the longitudinal direction, and the third side surface 4c and the fourth side surface 4d extending in the lateral direction. The steps 4x are formed at the ends of the sides of the first side surface 4a and the second side surface 4b in the longitudinal direction, where the sides of the first side surface 4a and the second side surface 4b are near to the sensing target 2. As a result, a change in the magnetic flux density By in Y-axis direction toward the ends can be suppressed and the sensitivity of the magnetic sensor unit 1 can be kept uniform in a wide area in the longitudinal direction of the magnetic sensor unit 1 while preventing an influence exerted by the external magnetic flux.

Embodiment 3

A magnetic sensor device 30 according to Embodiment 3 of the present disclosure is described with reference to FIGS. 10 and 11. The same or corresponding components are given the same reference numerals in these figures together with the drawings of the other embodiments. In the present embodiment as well, the magnetic sensor device 30 includes a magnetic sensor unit 1 containing a magnet 3, a magnetic shield unit 4, a housing 6, and a cover 5. The magnetic sensor unit 1 detects a magnetic component of a sensing target 2. The magnetic sensor unit 1, the housing 6, and the cover 5 have the same structures and functions as described in Embodiment 1.

Figure 10:
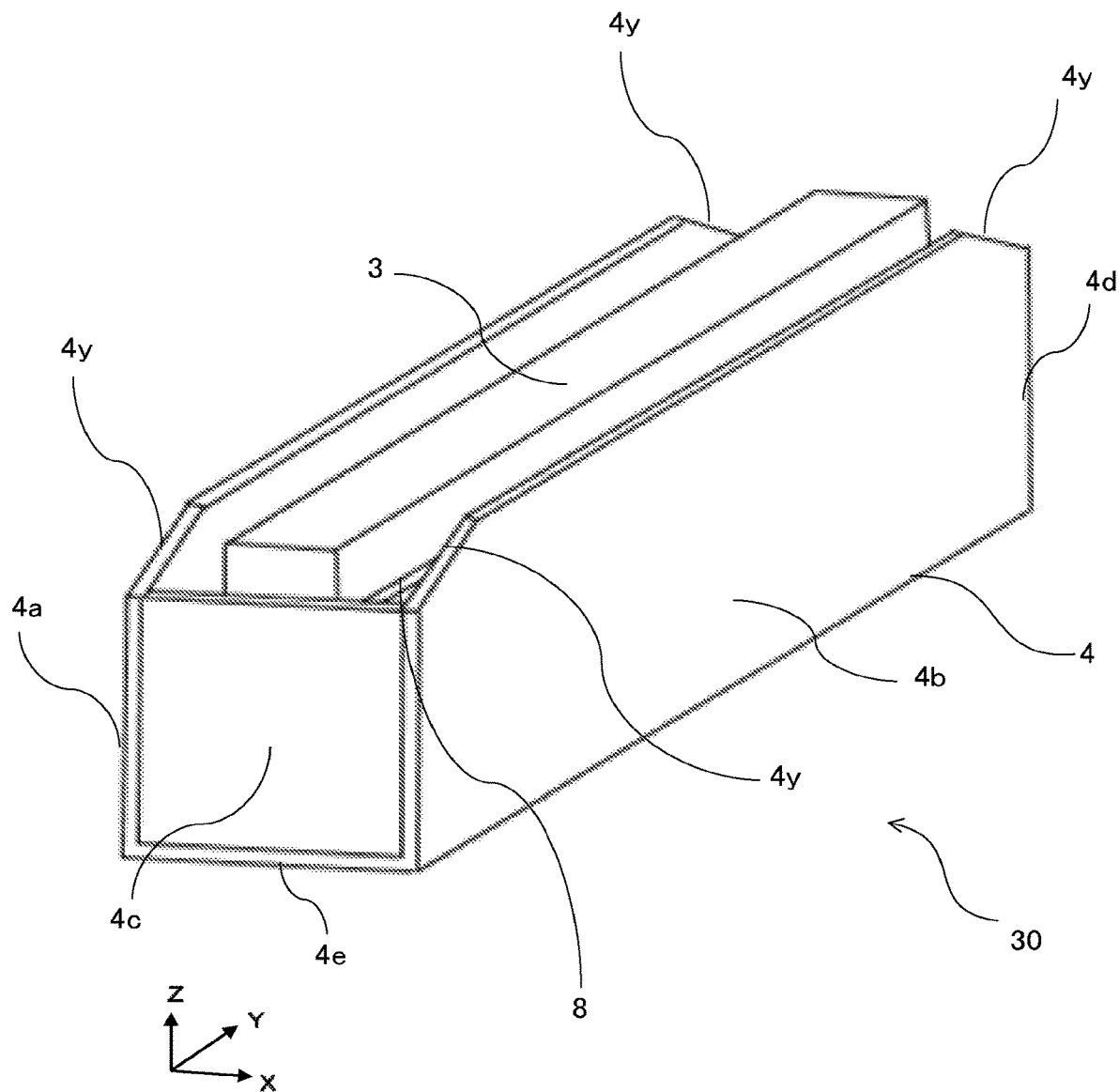
FIG. 10 is a perspective view of a magnetic sensor device according to Embodiment 3 of the present disclosure.

FIG. 10 is a perspective view of the magnetic sensor device 30 according to Embodiment 3. In order to facilitate understanding the structure of the magnetic sensor device 30, the magnetic sensor unit 1, the cover 5, and the housing 6 are not shown. The present embodiment differs from Embodiments 1 and 2 in a part of the magnetic shield unit 4. In FIG. 10, the first side surface 4a and the second side surface 4b include tapered portions 4y that have a notch shape and are formed at at least one of vertices of the rectangular surface extending in the longitudinal direction, where the vertices face the sensing target 2. The cover 5 covers the tapered portions 4y.

The third side surface 4c of the magnetic shield unit 4 shown in FIG. 10 is contiguous to the first side surface 4a and the second side surface 4b. The lengths of the contiguous portions of the third side surface 4c in Z-axis direction are equal to the length of the contiguous portion of the first side surface 4a and the length of the contiguous portion of the second side surface 4b. The fourth side surface 4d of the magnetic shield unit 4 is also contiguous to the first side surface 4a and the second side surface 4b although such a relationship between the fourth side surface 4d and the first and second side surfaces 4a and 4b can not be viewed in FIG. 10. The lengths of the contiguous portions of the fourth side surface 4d in Z-axis direction are equal to the length of the contiguous portion of the first side surface 4a and the length of the contiguous portion of the second side surface 4b. Unlike in the magnetic shield unit 4 shown in FIGS. 8A and 8B in Embodiment 2, the first side surface 4a and the second side surface 4b have the tapered portions 4y at their ends, instead of the steps 4x. In other words, the magnetic sensor device 30 according to the present embodiment has a sloping shape (tapered shape) in which the first side surface 4a and the second side surface 4b have the lowest heights at the furthest ends of the first side surface 4a and the second side surface 4b in the longitudinal direction, the heights of the first side surface 4a and the second side surface 4b increase toward the center portion in the longitudinal direction to become equal to the length at the center portion in the longitudinal direction.

As shown in FIG. 10, the heights of the third side surface 4c and the fourth side surface 4d are lower than the levels of the upper ends of the magnet 3, and the heights of the first side surface 4a and the second side surface 4b are equal to the levels of the upper ends of the magnet 3 in the center portion in the longitudinal direction. The heights of the first side surface 4a and the second side surface 4b in Z-axis direction decrease toward the ends of first side surface 4a or the second side surface 4b in the longitudinal direction, and the heights of the first side surface 4a and the second side surface 4b at the ends of first side surface 4a and the second side surface 4b are lower than the levels of the upper ends of the magnet 3.

Figure 11:
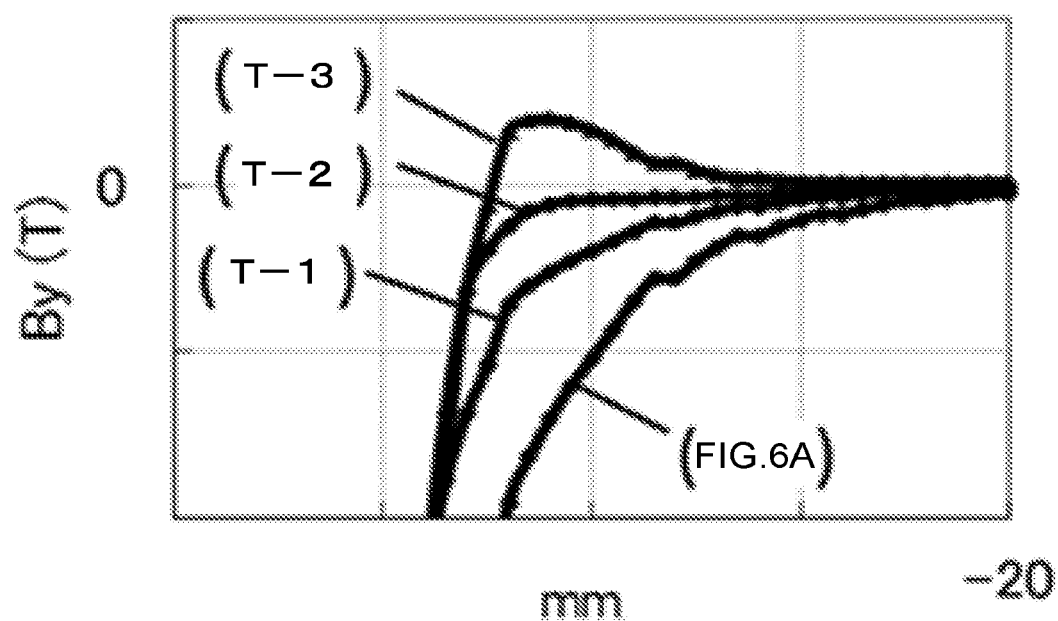
FIG. 11 is a graph showing the distribution of magnetic flux density in Y-axis direction in the magnetic sensor device according to Embodiment 3 of the present disclosure.

FIG. 11 is a graph showing the distribution of the magnetic flux density By in Y-axis direction depending on the position of the magnetoresistive element 1a placed on the magnet 3 in the magnetic sensor devices 10 and 30 according to Embodiments 1 and 3. FIG. 11 is a graph comparing the magnetic flux densities By in the longitudinal direction depending on the position of the magnetoresistive element 1a under three different conditions for the magnetic sensor device 30 in the present embodiment. The drawing number of the magnetic sensor device 10 (6A) and reference symbols (T-1), (T-2), and (T-3) corresponding to the three conditions are described near to ends of the leader lines drawn from the curves indicating changes in the magnetic flux density By.

In FIG. 11, the vertical axis indicates the value in teslas (T), and the horizontal axis indicates the value in millimeters (mm). The horizontal axis indicates the position in Y-axis direction, and FIG. 11 is an enlarged view of the area for positions in the negative direction along Y-axis.

The conditions of (T-1), (T-2), and (T-3) in FIG. 11 are described below. When the length of each tapered portion 4y that is tapered (sloping) is defined as 1 under the condition (T-1), the length of each tapered portion 4y is 1.16 under the condition (T-2) and the length of each tapered portion 4y is 1.3 under the condition (T-3). The magnetic flux density By at the ends in the longitudinal direction changes in the positive direction of the vertical axis as the lengths of the tapered portions 4y of the first side surface 4a and the second side surface 4b increase. That is, this means that an increase in the length of each tapered portion 4y causes a reduction in the effect of attracting the magnetic flux of the magnet 3 to the ends of the first side surface 4a and the second side surface 4b in the longitudinal direction, and thus the increase in the length of each tapered portion 4y causes a higher effect of uniforming the magnetic flux density By in the longitudinal direction. In other words, in the first side surface 4a and the second side surface 4b, it is concluded that the degree to which portions other than the tapered portions 4y attract the magnetic flux of the magnet 3 in the longitudinal direction is greater than the degree to which the tapered portions 4y attract the magnetic flux of the magnet 3 in the longitudinal direction.

Accordingly, The magnetic sensor device 30 can be obtained that has uniform sensitivity in a wide area in the longitudinal direction at the magnetic sensor position while preventing an influence exerted by an external magnetic flux. However, the condition (T-2) is preferable for the purpose of expanding the area in which the magnetic flux density By in the longitudinal direction is within a certain range of values around 0. The condition (T-3) could cause an excessive correction. There is no need to increase the lengths of the tapered portions 4y of the first side surface 4a and the second side surface 4b to the center portions and it is preferable that appropriate lengths of each of the tapered portions 4y are determined in accordance with the conditions including the magnetic force of the magnet 3 and the width of the transport path.

As described above, the magnetic shield unit 4 of the magnetic sensor device 30 according to the present embodiment includes the first side surface 4a and the second side surface 4b extending in the longitudinal direction, and the third side surface 4c and the fourth side surface 4d extending in the lateral direction. The tapered portions 4y are formed at the ends of the sides of the first side surface 4a and the second side surface 4b in the longitudinal direction, where the sides of the first side surface 4a and the second side surface 4b are near to the magnetic sensor unit 1. Accordingly, a change in the magnetic flux density By in Y-axis direction toward the ends can be suppressed and the sensitivity of the magnetic sensor unit 1 can be kept uniform in a wide area in the longitudinal direction of the magnetic sensor unit 1 while preventing an influence exerted by an external magnetic flux.

Embodiment 4

A magnetic sensor device 40 according to Embodiment 4 of the present disclosure is described with reference to FIGS. 12A, 12B, and 13. The same or corresponding components are given the same reference numerals in these drawings together with the other drawings in the other embodiments. In the present embodiment as well, the magnetic sensor device 40 includes a magnetic sensor unit 1 containing a magnet 3', a magnetic shield unit 4, a housing 6, and a cover 5. The magnetic sensor unit 1 detects a magnetic component of a sensing target 2. The magnetic sensor unit 1, the housing 6, and the cover 5 have the same structures and functions as described in Embodiment 1.

Figure 12A:
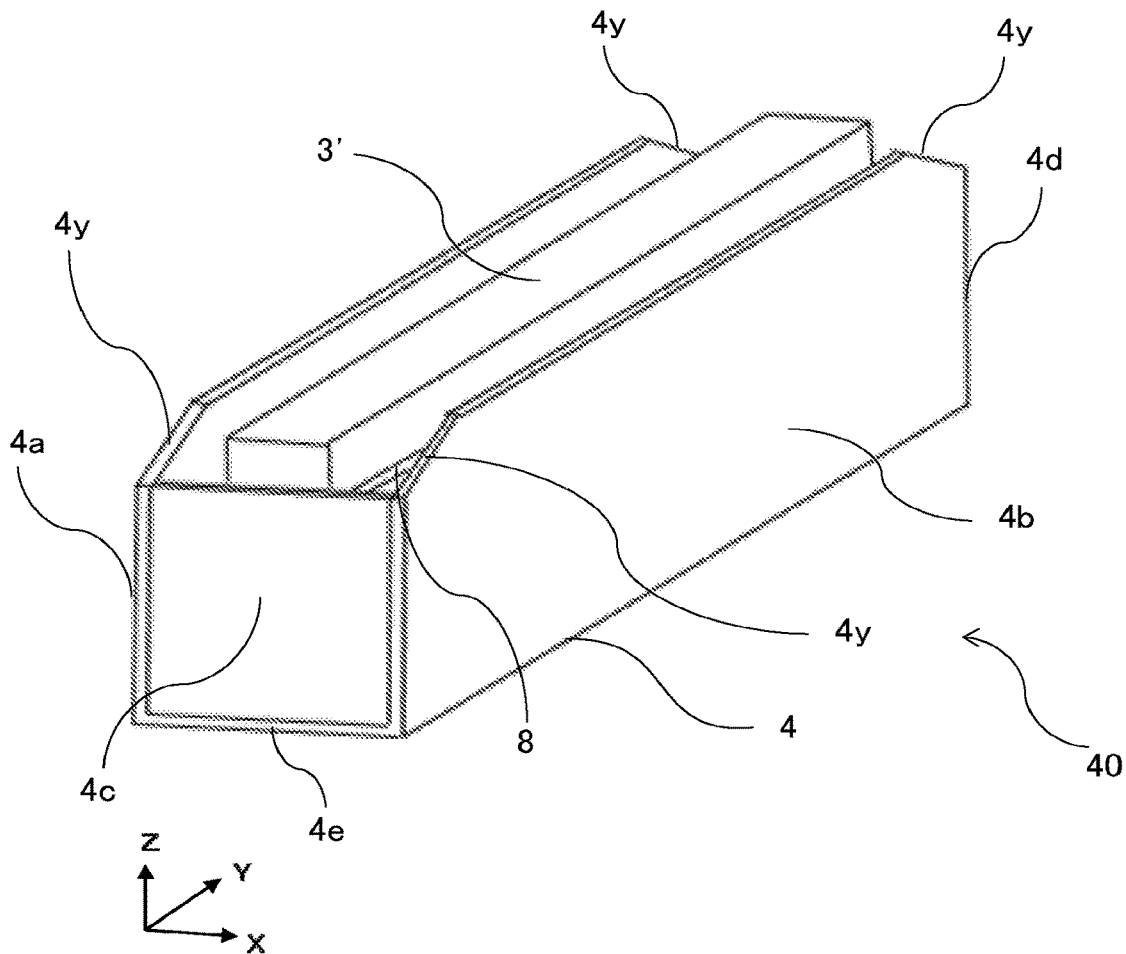
FIG. 12A is a perspective view of a magnetic sensor device according to Embodiment 4 of the present disclosure.

FIG. 12A is a perspective view of the magnetic sensor device 40 according to Embodiment 4. In order to facilitate understanding of the structure of the magnetic sensor device 40, the magnetic sensor unit 1, the cover 5, and the housing 6 are not shown. FIG. 12B is a perspective view of the magnet 3' and a bottom yoke 8 in the magnetic sensor device 40 according to Embodiment 4 around an end in the negative Y direction. The present embodiment differs from Embodiments 1 to 3 in the structure of the magnet 3'.

Figure 12B:
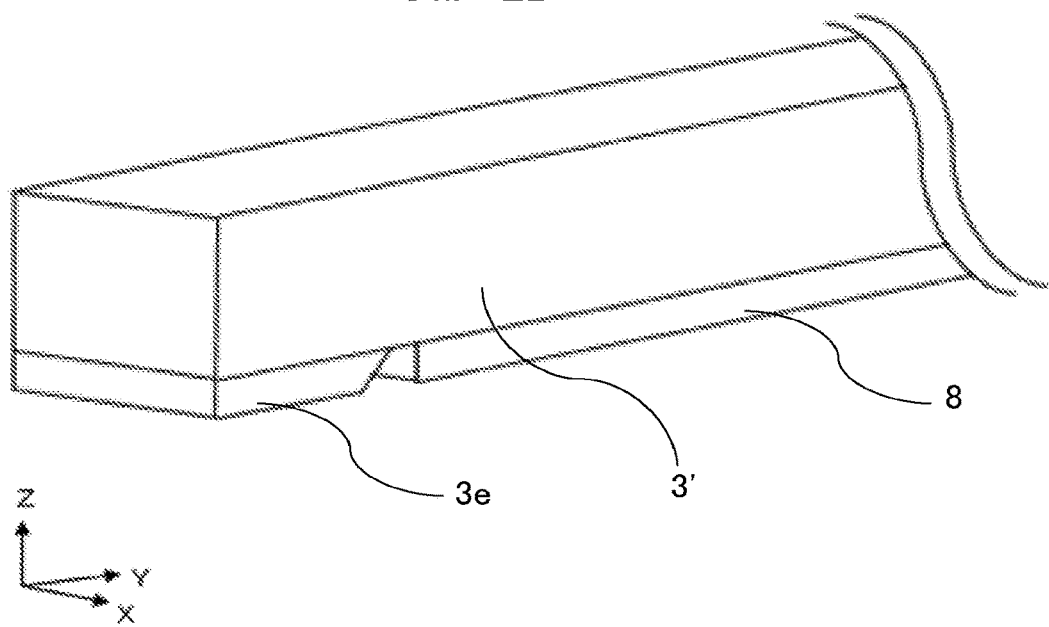
FIG. 12B is a perspective view of a magnet of the magnetic sensor device according to Embodiment 4 of the present disclosure.

In FIG. 12B, the magnet 3' includes a magnet 3e that is added for the purpose of increasing the magnet thickness that is the thickness in Z-axis direction at ends in the longitudinal direction so as to be thicker than the thicknesses of portions other than the ends in the longitudinal direction. Except for the magnet 3e, the magnetic sensor device 40 according to Embodiment 4 has the same structure as that of the magnetic sensor device 30 according to Embodiment 3.

In the magnetic sensor devices 10, 20, and 30 according to Embodiments 1 to 3, the magnet 3 is a rectangular prism and the bottom yoke 8 is disposed on the bottom surface of the magnet 3. In the magnetic sensor device 40 according to Embodiment 4, for example, the thicknesses of the magnet 3' in Z-axis direction at ends of the magnet 3' in the longitudinal direction are thicker than the thicknesses of the magnet 3' in Z-axis direction at portions of the magnet 3' other than the ends in the longitudinal direction and the bottom yoke 8 is not provided on areas of the bottom surface of the magnet 3' corresponding to the ends in the longitudinal direction. In other words, the bottom yoke 8 is formed on the portions other than the ends of the magnet 3' in the longitudinal direction. The magnet 3 and the magnet 3e may be separate members or may be molded as one integral piece.

Figure 13:
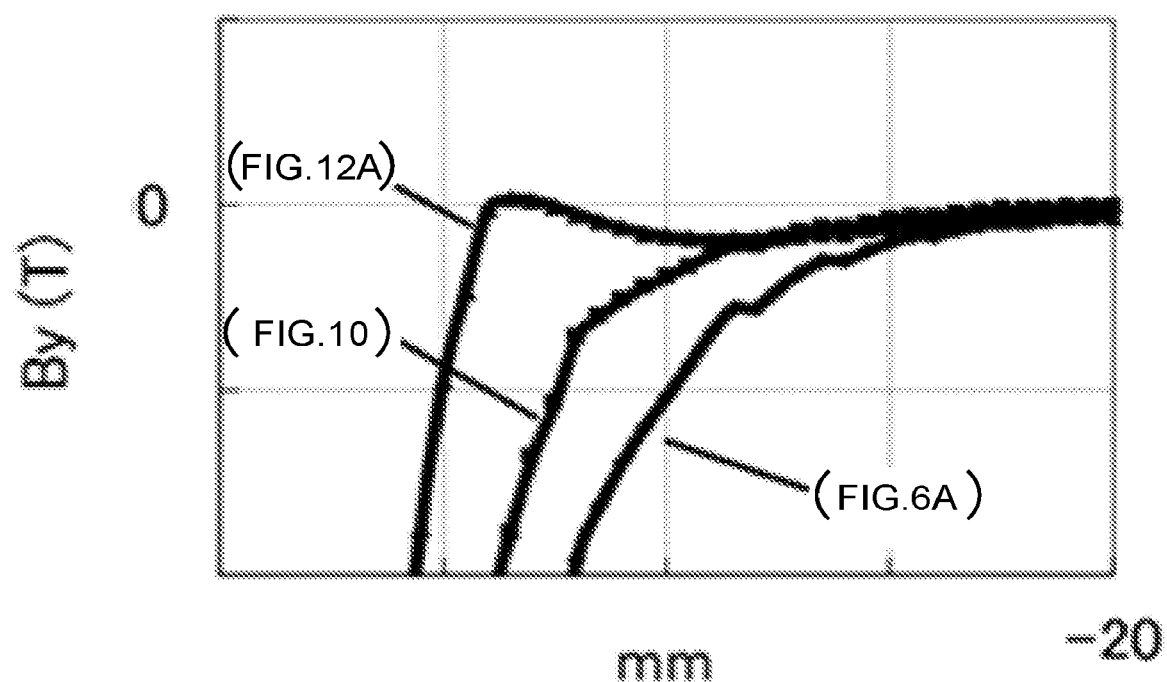
FIG. 13 is a graph showing the distribution of magnetic flux density in Y-axis direction in the magnetic sensor device according to Embodiment 4 of the present disclosure.

FIG. 13 is a graph showing the distribution of magnetic flux in the longitudinal direction in the magnetic sensor device 40 according to the present embodiment. In FIG. 13, the drawing numbers of the magnetic sensor devices 10, 30 and 40 (FIGS. 6A, 10, 12A) corresponding to curves are described near to ends of the leader lines drawn from the curves indicating changes in the magnetic flux density By. The condition (T-1) is applied to the magnetic sensor device 30 according to Embodiment 3 shown in FIG. 10.

In FIG. 13, the vertical axis indicates the value in teslas (T), and the horizontal axis indicates the value in millimeters (mm). The horizontal axis indicates the position in Y-axis direction, and FIG. 13 is an enlarged view of the area for positions in the negative direction along Y-axis.

Regarding the magnetic flux density By at the ends in the longitudinal direction, it is understood that an area of the present embodiment in which the magnetic flux density By in Y-axis direction is near zero is wider than those of the magnetic sensor device 10 shown in FIG. 6A and the magnetic sensor device 30 shown in FIG. 10 used herein for comparison with the present embodiment. Accordingly, by the use of the magnet 3e, the magnetic sensor device 40 can be obtained that have uniform sensitivity in a wide area in the longitudinal direction of the magnet 3' while preventing an influence exerted by an external magnetic flux.

As described above, the magnet 3' of the magnetic sensor device 40 according to the present embodiment includes the magnet 3e that is added for the purpose of increasing the magnet thickness that is the thickness in Z-axis direction at ends in the longitudinal direction so as to be thicker than the thicknesses of portions other than the ends in the longitudinal direction. This structure makes it possible to more suppress a decrease in the magnetic flux density By in Y-axis direction toward the ends and allows the magnetic sensor unit 1 to have uniform sensitivity in a wide area in the longitudinal direction while preventing an influence exerted by an external magnetic flux.

Embodiment 5

A magnetic sensor device 50 according to Embodiment 5 of the present disclosure is described with reference to FIGS. 14A, 14B, and 15. The same or corresponding components are given the same reference numerals in these figures together with the drawings of the other embodiments. In the present embodiment as well, the magnetic sensor device 50 includes a magnetic sensor unit 1 containing a magnet 3", a magnetic shield unit 4, a housing 6, and a cover 5. The magnetic sensor unit 1 detects a magnetic component of a sensing target 2. The magnetic sensor unit 1, the housing 6, and the cover 5 have the same structures and functions as described in Embodiment 1.

Figure 14A:
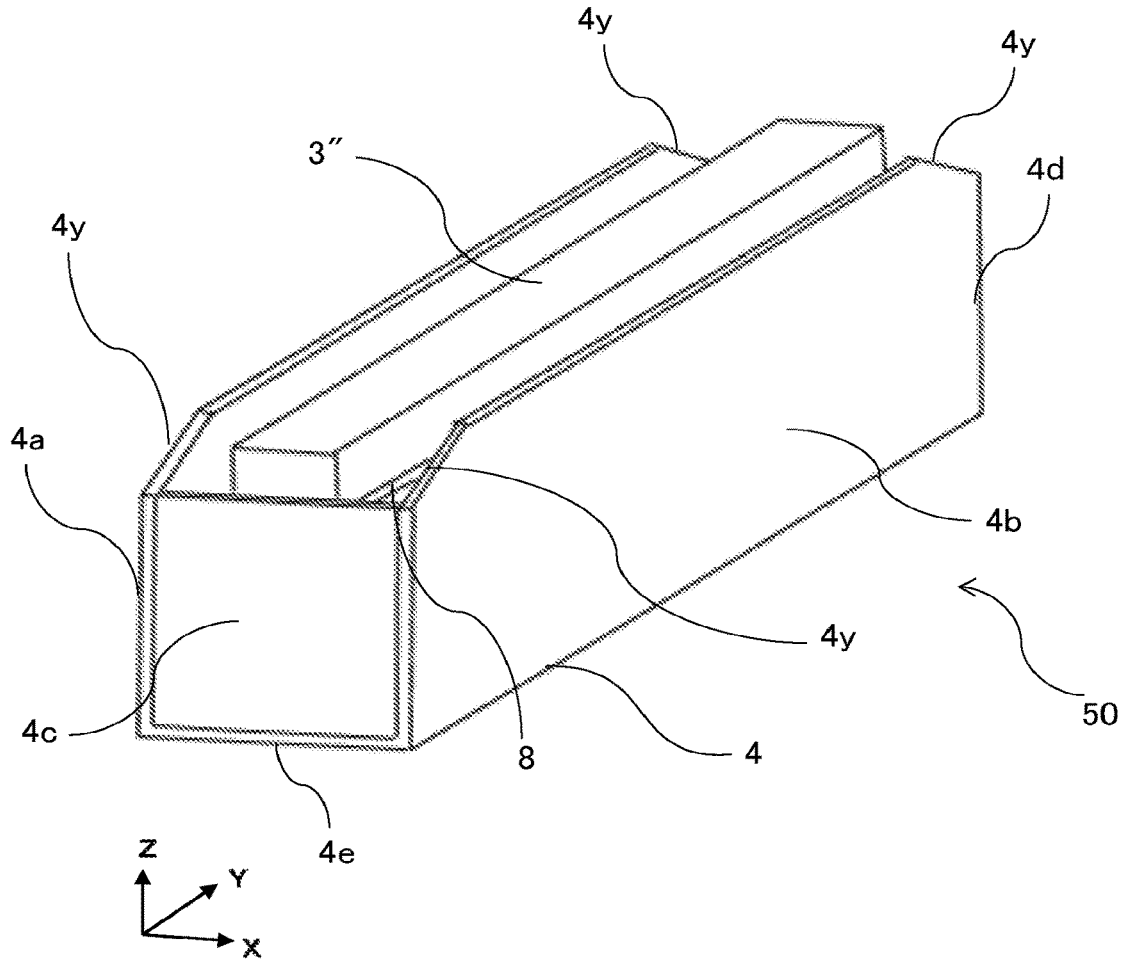
FIG. 14A is a perspective view of a magnetic sensor device according to Embodiment 5 of the present disclosure.

FIG. 14A is a perspective view of the magnetic sensor device 50 according to Embodiment 5. In order to facilitate understanding the structure of the magnetic sensor device 50, the magnetic sensor unit 1, the cover 5, and the housing 6 are not shown. FIG. 14B is a perspective view of the magnet 3" and a bottom yoke 8 in the magnetic sensor device 50 according to Embodiment 5. The present embodiment differs from Embodiments 1 to 4 in the structure of the magnet 3".

Figure 14B:
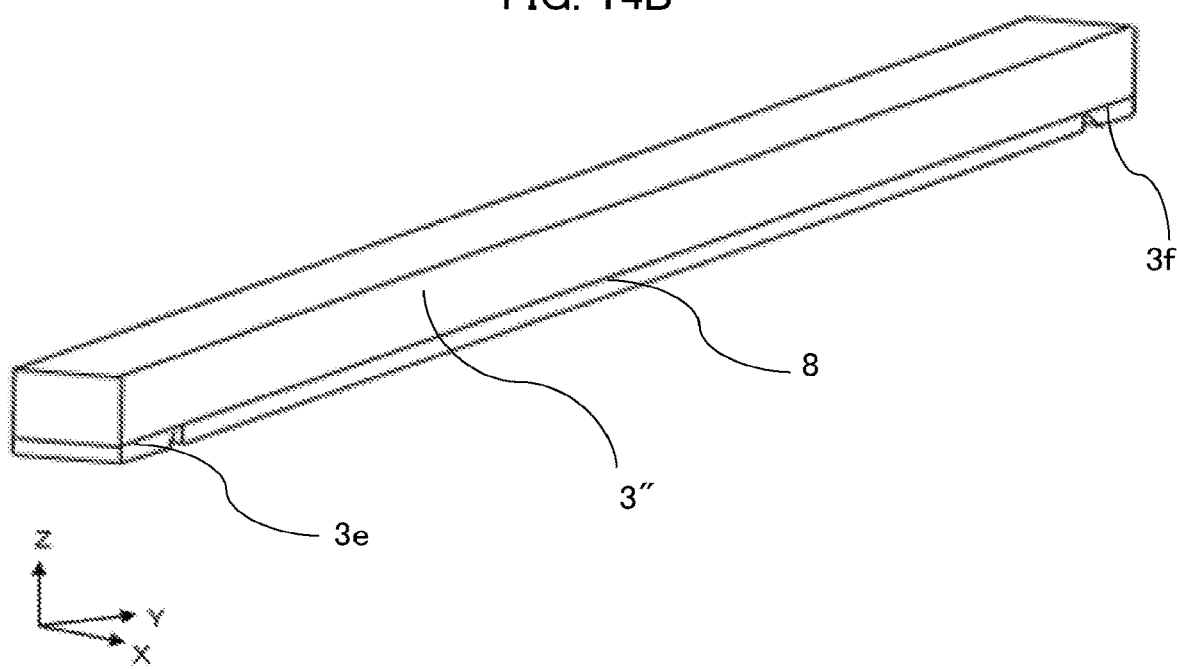
FIG. 14B is a perspective view of a magnet of the magnetic sensor device according to Embodiment 5 of the present disclosure.

In FIG. 14B as well as FIG. 12B, the magnet 3" includes the magnet 3e and a magnet 3f that are added for the purpose of increasing the magnet thickness that is the thickness in Z-axis direction at both ends in the longitudinal direction so as to be thicker than the thicknesses of portions other than the both ends in the longitudinal direction. In the present embodiment, the thickness of the magnet 3e disposed at one of the both ends in the longitudinal direction is different from the thickness of the magnet 3f disposed at the other of both ends in the longitudinal direction. In other words, the magnet thickness (overall thickness of the magnet 3 and the magnet 3e or 3f) in Z-axis direction at one of the ends in the longitudinal direction differs from the magnet thickness at the other of the ends in the longitudinal direction. Except for the magnets 3e and 3f that are difference in thickness, the magnetic sensor device 50 according to Embodiment 5 has the same structure as the magnetic sensor device 30 according to Embodiment 3.

In the magnetic sensor device 50 according to Embodiment 5 as well as the magnetic sensor device 40 according to Embodiment 4, the magnet thicknesses in Z-axis direction at the ends in the longitudinal direction of the magnet 3" are thicker than the magnet thicknesses of portions of the magnet 3" other than the ends in the longitudinal direction, and the bottom yoke 8 is not provided on areas of the bottom surface corresponding to the ends in the longitudinal direction. In other words, the bottom yoke 8 is formed on the portions other than the ends of the magnet 3" in the longitudinal direction. When the magnet 3f in the end in the positive Y direction that is near to the fourth side surface 4d has, for example, a thickness of 1, the magnet 3e in the other end in the negative Y direction that is near to the third side surface 4c has a thickness of 1.18. The magnet 3 and the magnets 3e and 3f with different thicknesses at two positions may be separate members or may be molded as one integral piece.

Figure 15:
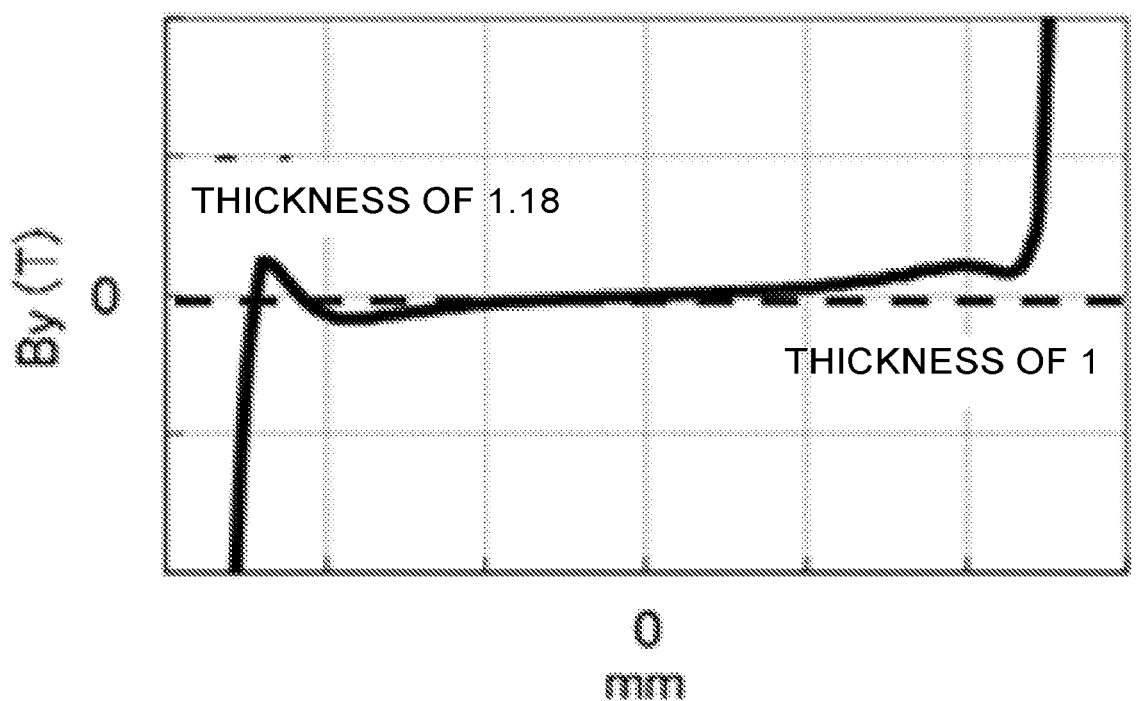
FIG. 15 is a graph showing the distribution of magnetic flux density in Y-axis direction in the magnetic sensor device according to Embodiment 5 of the present disclosure.

FIG. 15 is a graph showing the distribution of magnetic flux in the longitudinal direction in the magnetic sensor device 50 according to the present embodiment. In FIG. 15, the vertical axis indicates the value in teslas (T), and the horizontal axis indicates the value in millimeters (mm).

The length of the area in which the thickness of the magnet is thick (thickness of 1.18) is long at the end on the negative Y direction side, so that, regarding the magnetic flux density By, the effect of changing a magnetic flux in the negative Y direction back to the positive value in this area is strong. The length of the area in which the magnet is thick (thickness of 1) is short at the end on the positive Y direction side in the longitudinal direction, so that, in this area, regarding the magnetic flux density By, the effect of changing the magnetic flux in the negative Y direction back to the positive value in this area is weak. Thus, the magnetic sensor device 50 according to the present embodiment is preferable for a case in which the magnetic flux density By in the longitudinal direction is kept around zero and a state in which the magnetic field as a whole is intended generally toward the positive side is preferable.

As described above, the magnet 3" in the magnetic sensor device 50 according to the present embodiment includes the magnets 3e and 3f that are added for the purpose of increasing the magnet thickness that is the thickness in Z-axis direction at both ends in the longitudinal direction so as to be thicker than the thicknesses of portions other than the both ends in the longitudinal direction. Accordingly, the magnetic sensor unit 1 can maintain sensitivity in the vicinity of each of the both ends in the longitudinal direction while preventing an influence exerted by an external magnetic flux.

Embodiment 6

A magnetic sensor device 10 according to Embodiment 6 of the present disclosure is described with reference to FIG. 2. In the present embodiment as well, the magnetic sensor device 10 includes a magnetic sensor unit 1 containing a magnet 3, a magnetic shield unit 4, a housing 6, and a cover 5. The magnetic sensor unit 1 detects a magnetic component of a sensing target 2. The magnetic sensor unit 1, the housing 6, and the cover 5 have the same structures and functions as described in Embodiment 1. The magnetic sensor device 10 according to the present embodiment includes auxiliary side surfaces 41 and 42. That is, the magnetic sensor unit 1 is located inside a space surrounded by the magnetic shield unit 4, the cover 5, and the auxiliary side surfaces 41 and 42. In FIG. 2, the auxiliary side surface 41 is contiguous to the third side surface 4c to form a side surface. The auxiliary side surface 41 and the third side surface 4c may be integrally formed to serve as the third side surface 4c. The auxiliary side surface 41 is located near an end of the magnetic sensor unit 1 or the cover 5 in the longitudinal direction.

Although the auxiliary side surface 42 is partially hidden in FIG. 2, the auxiliary side surface 42 is contiguous to the fourth side surface 4d to form a side surface in the same manner as the auxiliary side surface 41. The auxiliary side surface 42 and the fourth side surface 4d may be integrally formed to serve as the fourth side surface 4d. The auxiliary side surface 42 is located near an end of the magnetic sensor unit 1 or the cover 5 in the longitudinal direction.

The magnetic sensor device 10 according to Embodiment 6 includes the auxiliary side surfaces 41 and 42, so that the magnetic sensor device 10 according to Embodiment 6 produces an effect of making it hard to cause occurrence of a gap between the magnetic shield unit 4 and the cover 5, in addition to the operation effects as produced by the magnetic sensor devices 10, 20, 30, 40, and 50 according to Embodiments 1 to 5.

As described above, the magnetic sensor device 10 according to the present embodiment includes (i) the auxiliary side surface 41 that is contiguous to or integrated with the third side surface 4c and that is located near to one end of the magnetic sensor unit 1 or the cover 5 and (ii) the auxiliary side surface 42 that is contiguous to or integrated with the fourth side surface 4d and that is located near to the other end of the magnetic sensor unit 1 or the cover 5. Accordingly, the magnetic sensor device 10 can be obtained that has uniform sensitivity around the both ends of the magnetic sensor unit 1 in the longitudinal direction and that has no gap between the magnetic shield unit 4 and the cover 5 while preventing an influence exerted by an external magnetic flux.

Figure 16:
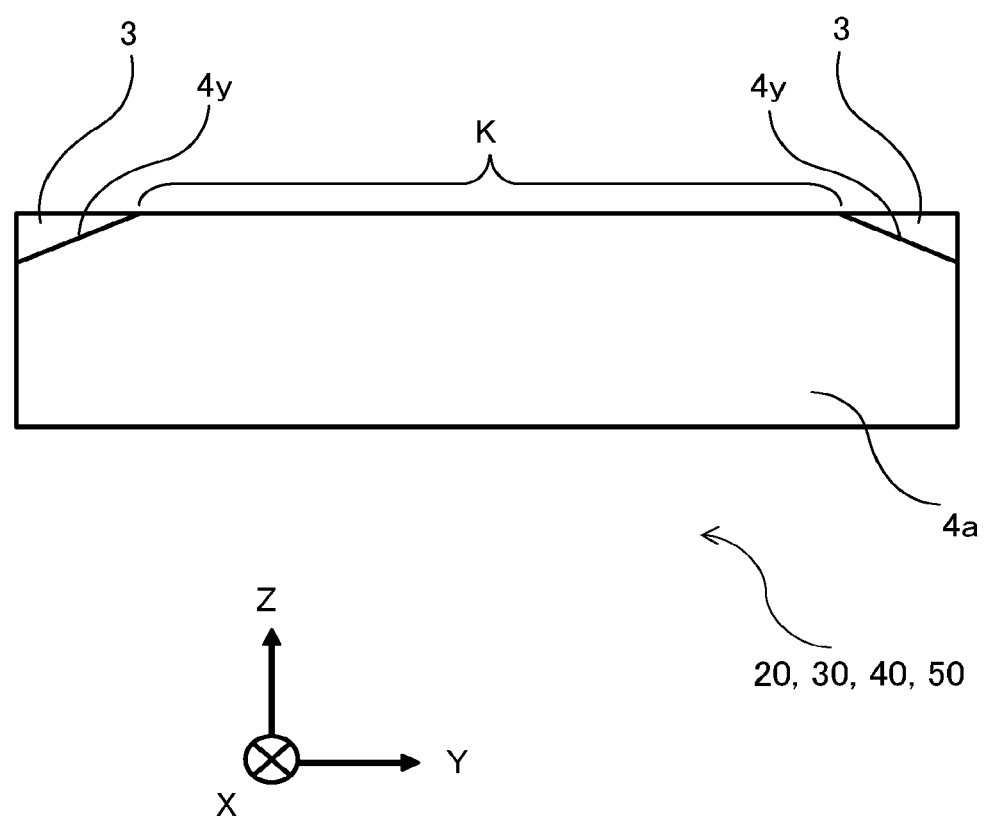
FIG. 16 is a plan view of a first side surface in the lateral direction.

In the magnetic sensor devices 20, 30, 40, and 50 according to Embodiments 2 to 6, as shown in FIG. 16, the first side surface 4a and the magnet 3 overlap each other in a portion K of the end of the first side surface 4a near the sensing target 2 along the longitudinal direction, where the portion K is an area surrounding the central portion and is a portion other than the step 4x and the tapered portion 4y in a plan view of the first side surface 4a in the lateral direction (positive X direction). FIG. 16 is a plan view of the first side surface 4a including the tapered portions 4y in the lateral direction, and FIG. 16 is a view for a case in which the first side surface 4a includes the tapered portions 4y. Similarly, the second side surface 4b and the magnet 3 overlap each other in a portion K of the end of the second side surface 4b near the sensing target 2 along the longitudinal direction, where the portion K is the area surrounding the central portion and is a portion other than the step 4x and the tapered portion 4y in a plan view of the second side surface 4b in the lateral direction (negative X direction).

In other words, the first side surface 4a and the magnet 3 do not overlap each other in the step 4x or the tapered portion 4y that is a portion of the end of the first side surface 4a near the sensing target 2 along the longitudinal direction, in a plan view of the first side surface 4a in the lateral direction. Similarly, the second side surface 4b and the magnet 3 do not overlap each other in the step 4x or the tapered portion 4y that is a portion of the end of the second side surface 4b near the sensing target 2 along the longitudinal direction in a plan view of the second side surface 4b in the lateral direction.

In the magnetic sensor devices 20, 30, 40, and 50 according to the Embodiments 2 to 6, unlike in the structure shown in FIG. 16, the long side of the first side surface 4a located between the tapered portions 4y and may not be aligned with the upper surface of the magnet 3 (upper surface in the positive Z direction) in a plan view of the first side surface 4a in the lateral direction (positive X direction). The same applies to the second side surface 4b in a plan view in the lateral direction (negative X direction). The same also applies to the structures described with reference to FIGS. 17 and 18 below.

Figure 17:
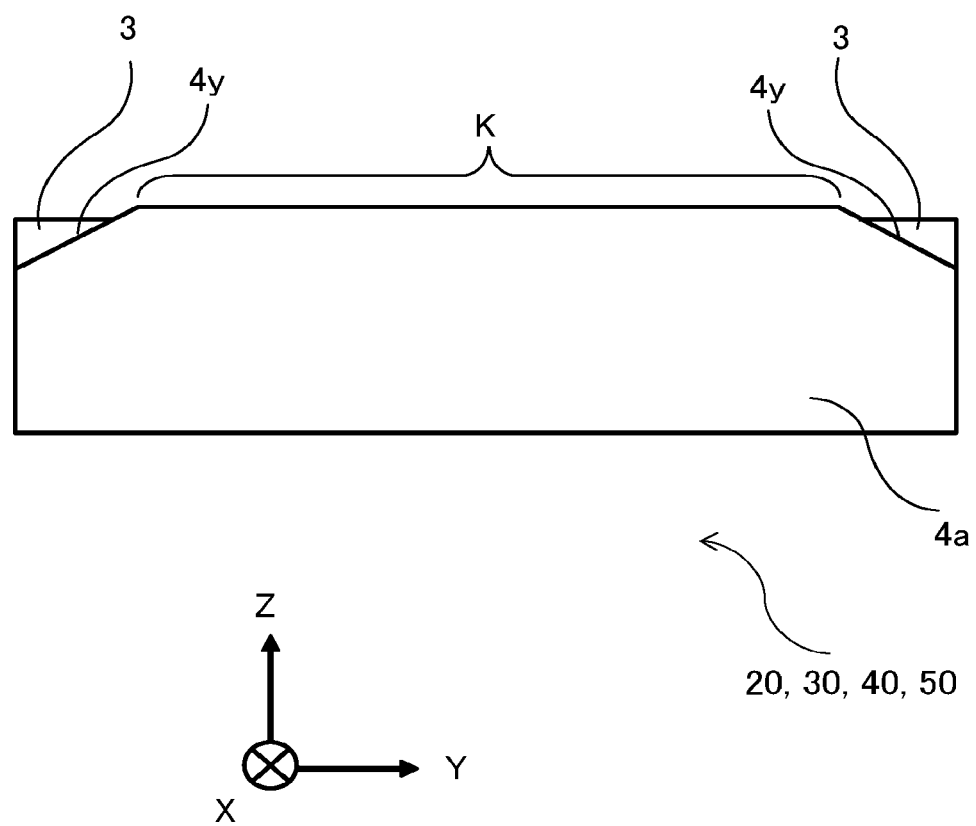
FIG. 17 is a plan view of the first side surface in the lateral direction.

As shown in FIG. 17, the upper surface of the magnet 3 (upper surface in the positive Z direction) may be located under the long side of the first side surface 4a located between the tapered portions 4y in a plan view of the first side surface 4a of the magnetic sensor devices 20, 30, 40, and 50 in the lateral direction (positive X direction).

Figure 18:
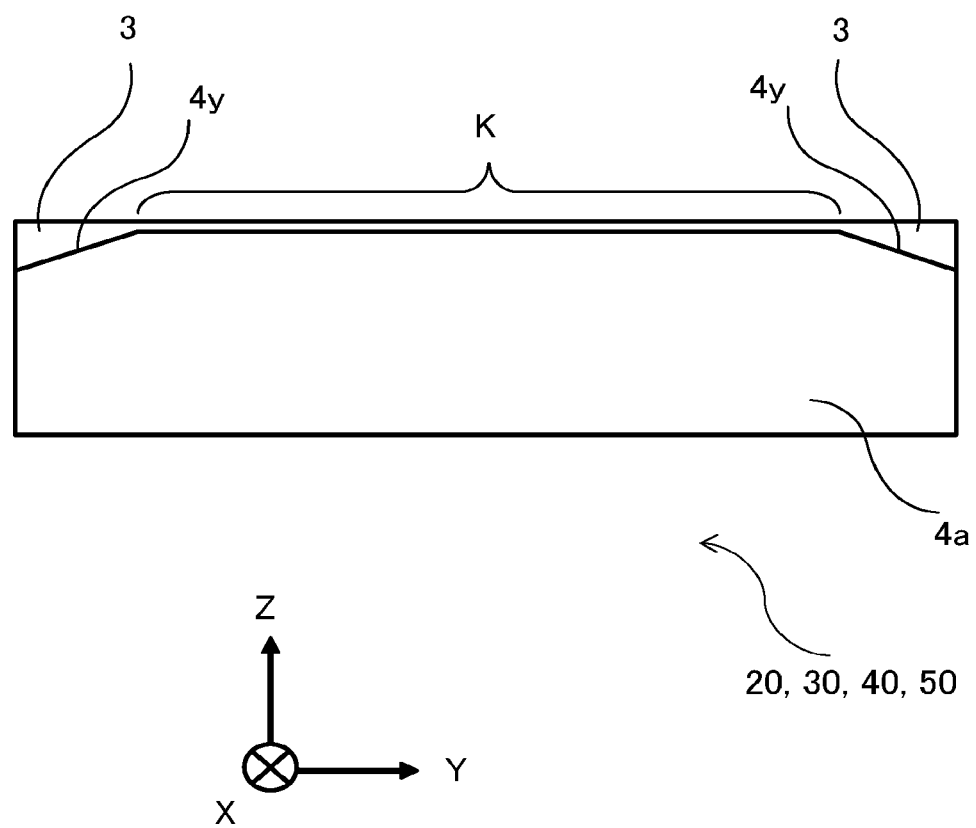
FIG. 18 is a plan view of the first side surface in the lateral direction.

Also, as shown in FIG. 18, the upper surface of the magnet 3 (upper surface in the positive Z direction) may be located above the long side of the first side surface 4a located between the tapered portions 4y in a plan view of the first side surface 4a of the magnetic sensor devices 20, 30, 40, and 50 in the lateral direction (positive X direction).

In FIGS. 17 and 18, as well as the structure described with reference to FIG. 16, the first side surface 4a and the magnet 3 do not overlap each other in the step 4x or the tapered portion 4y that is a portion of the end of the first side surface 4a near the sensing target 2 along the longitudinal direction in a plan view of the first side surface 4a in the lateral direction (positive X direction). In FIG. 18, the first side surface 4a and the magnet 3 do not overlap each other even on the long side of the first side surface 4a located between the tapered portions 4y, and an exposed portion of the lateral surface of the magnet 3 has a larger length in Z-axis direction in the area corresponding to each tapered portion 4y.

As described above, the structure according to the present disclosure includes the magnetic sensor unit that includes the magnet extending in the longitudinal direction and the magnetoresistive element, the magnetic shield unit supporting or containing the magnetic sensor unit, and the cover located between the magnetic sensor unit and the sensing target to cover the magnetic shield unit. The magnetic shield unit has the opening facing in a direction from the magnetoresistive element toward the transport path of the sensing target. The opening is defined by two long sides along the longitudinal direction and two short sides along the lateral direction. The two long sides are nearer to the sensing target than the two short sides are. This structure makes it possible to suppress a reduction in the sensitivity of the magnetic sensor unit at the end in the longitudinal direction perpendicular to the transport direction of a sensing target and to obtain a magnetic shielding effect.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2017-139652, filed on Jul. 19, 2017, the entire disclosure of which is incorporated by reference herein.

REFERENCE SIGNS LIST

1 Magnetic sensor unit
1a Magnetoresistive element
1b Sensor board
1c Wire
1d Mount
1e External connector
2 Sensing target
3, 3', 3" Magnet
3e, 3f Magnet
4 Magnetic shield unit
4a First side surface
4b Second side surface
4c Third side surface
4d Fourth side surface
4e Bottom surface
4h Hole
4i Through-hole
4o Opening
4s Side surface
4t Side surface
4x Step
4y Tapered portion
5 Cover
5a Tapered portion
5b Transport surface portion
6 Housing
6a Stepped portion
6b First opening
6c Second opening
6d Recess
7 Fastener
8 Bottom yoke
10, 20, 30, 40, 50, 60 Magnetic sensor device
41 Auxiliary side surface
42 Auxiliary side surface

The invention claimed is:

1. A magnetic sensor device for detecting a magnetic component of a sensing target, the device comprising:
a magnetic sensor unit including a rod-shaped magnet extending in a longitudinal direction and a magnetoresistive element located between the magnet and the sensing target;
a magnetic shield unit supporting or containing the magnetic sensor unit, the magnetic shield unit having facing surfaces facing the magnetic sensor unit except at least a portion of a surface of the magnetic sensor unit facing the sensing target,
the facing surfaces including
a first side surface and a second side surface extending in the longitudinal direction of the magnet to face each other with the magnet located between the first and second side surfaces,
a third side surface and a fourth side surface extending in a lateral direction intersecting with the longitudinal direction to face each other with the magnet located between the third and fourth side surfaces, and
a bottom surface extending in the longitudinal direction at a position opposite to the sensing target relative to the magnetic sensor unit; and
a cover disposed between the magnetic sensor unit and the sensing target, the cover covering the magnetic shield unit,
wherein, in the magnetic shield unit, lengths of the third side surface and the fourth side surface in a perpendicular direction are smaller than a largest length of lengths of the first side surface and the second side surface in the perpendicular direction, the perpendicular direction being a direction from the bottom surface toward the cover and being perpendicular to the longitudinal direction and the lateral direction,
the third side surface is contiguous to the first side surface and the second side surface, and the fourth side surface is contiguous to the first side surface and the second side surface, and
lengths of contiguous portions of the first side surface and the second side surface in the perpendicular direction are equal to a length of a contiguous portion of the third side surface in the perpendicular direction, and lengths of contiguous portions of the first side surface and the second side surface in the perpendicular direction are equal to a length of a contiguous portion of the fourth side surface in the perpendicular direction.

2. The magnetic sensor device according to claim 1, wherein
a portion of the first side surface or the second side surface that has a smallest length in the perpendicular direction is a portion contiguous to the third side surface or the fourth side surface.

3. The magnetic sensor device according to claim 1, wherein
the first side surface or the second side surface includes a stepped portion or a tapered portion in at least one of vertices facing the sensing target in a rectangular surface extending in the longitudinal direction.

4. The magnetic sensor device according to claim 3, wherein
a degree to which a portion of the first side surface or the second side surface other than the stepped portion or the tapered portion attracts a magnetic flux of the magnet in the longitudinal direction is greater than a degree to which the stepped portion or the tapered portion of the first side surface or the second side surface attracts the magnetic flux of the magnet in the longitudinal direction.

5. The magnetic sensor device according to claim 3, wherein
the magnet overlaps a portion of an end of the first side surface other than the stepped portion or the tapered portion in a plan view of the first side surface in the lateral direction, the end of the first side surface being an end along the longitudinal direction that is near to the sensing target.

6. The magnetic sensor device according to claim 3, wherein
the cover covers the stepped portion or the tapered portion.

7. The magnetic sensor device according to claim 1, wherein
an auxiliary side surface is disposed between the third side surface and the cover, and the auxiliary side surface is formed in an end of the magnetic sensor unit or the cover in the longitudinal direction.

8. The magnetic sensor device according to claim 7, wherein
the magnetic sensor unit is located inside a space surrounded by the magnetic shield unit, the cover, and the auxiliary side surface.

9. The magnetic sensor device according to claim 1, wherein
a thickness of the magnet in the perpendicular direction at ends of the magnet in the longitudinal direction is thicker than a thickness of a portion of the magnet other than the ends of the magnet in the longitudinal direction.

10. The magnetic sensor device according to claim 9, wherein
a thickness of the magnet in the perpendicular direction at one of the ends of the magnet in the longitudinal direction is different from a thickness of the magnet in the perpendicular direction at an other of the ends of the magnet in the longitudinal direction.

11. A magnetic sensor device for detecting a magnetic component of a sensing target, the device comprising:
a magnetic sensor unit including a rod-shaped magnet extending in a longitudinal direction and a magnetoresistive element located between the magnet and the sensing target;
a box-shaped magnetic shield unit supporting or containing the magnetic sensor unit and having an opening facing the sensing target; and
a cover disposed between the magnetic sensor unit and the sensing target, the cover covering the magnetic shield unit,
wherein the opening of the magnetic shield unit is defined by two long sides in the longitudinal direction of the magnet and two short sides in a lateral direction intersecting with the longitudinal direction,
differences in level are made in a perpendicular direction at portions at which the two long sides are contiguous to the two short sides, the perpendicular direction being perpendicular to the longitudinal direction and the lateral direction,
the two long sides are located nearer the sensing target than the two short sides, and
heights of the two short sides in the perpendicular direction are higher than a level of a surface of the magnet opposite to a surface of the magnet that faces the sensing target.

12. The magnetic sensor device according to claim 11, wherein
a degree to which portions of the two long sides attract a magnetic flux of the magnet in the longitudinal direction is greater than a degree to which ends of the two long sides in the longitudinal direction attract the magnetic flux of the magnet in the longitudinal direction, the portions of the two long sides being away from the ends of the long sides in the longitudinal direction.

13. The magnetic sensor device according to claim 11, wherein
a thickness of the magnet in the perpendicular direction at ends of the magnet in the longitudinal direction is thicker than a thickness of a portion of the magnet other than the ends of the magnet in the longitudinal direction.

14. The magnetic sensor device according to claim 13, wherein
a thickness of the magnet in the perpendicular direction at one of the ends of the magnet in the longitudinal direction is different from a thickness of the magnet in the perpendicular direction at an other of the ends of the magnet in the longitudinal direction.

15. A magnetic sensor device for detecting a magnetic component of a sensing target, the device comprising:
a magnetic sensor unit including a rod-shaped magnet extending in a longitudinal direction and a magnetoresistive element located between the magnet and the sensing target;
a box-shaped magnetic shield unit supporting or containing the magnetic sensor unit and having an opening facing the sensing target; and
a cover disposed between the magnetic sensor unit and the sensing target, the cover covering the magnetic shield unit,
wherein the opening of the magnetic shield unit is defined by two long sides in the longitudinal direction of the magnet and two short sides in a lateral direction intersecting with the longitudinal direction, and
the two long sides approach the sensing target in a perpendicular direction perpendicular to the longitudinal direction and the lateral direction from each of contiguous portions toward centers of the two long sides such that the two long sides define a stepped portion or a tapered portion, the contiguous portions being portions at which the two long sides are contiguous to the two short sides.

16. The magnetic sensor device according to claim 15, wherein
a degree to which portions of the two long sides attract a magnetic flux of the magnet in the longitudinal direction is greater than a degree to which ends of the two long sides in the longitudinal direction attract the magnetic flux of the magnet in the longitudinal direction, the portions of the two long sides being away from the ends of the long sides in the longitudinal direction.

17. The magnetic sensor device according to claim 15, wherein
a thickness of the magnet in the perpendicular direction at ends of the magnet in the longitudinal direction is thicker than a thickness of a portion of the magnet other than the ends of the magnet in the longitudinal direction.

18. The magnetic sensor device according to claim 17, wherein
a thickness of the magnet in the perpendicular direction at one of the ends of the magnet in the longitudinal direction is different from a thickness of the magnet in the perpendicular direction at an other of the ends of the magnet in the longitudinal direction.

* * * * *